US010651284B2

(12) United States Patent
Xie et al.

(10) Patent No.: US 10,651,284 B2
(45) Date of Patent: *May 12, 2020

(54) METHODS OF FORMING GATE CONTACT STRUCTURES AND CROSS-COUPLED CONTACT STRUCTURES FOR TRANSISTOR DEVICES

(71) Applicant: GLOBALFOUNDRIES Inc., Grand Cayman (KY)

(72) Inventors: Ruilong Xie, Niskayuna, NY (US); Youngtag Woo, San Ramon, CA (US); Daniel Chanemougame, Niskayuna, NY (US); Bipul C. Paul, Mechanicville, NY (US); Lars W. Liebmann, Mechanicville, NY (US); Heimanu Niebojewski, Cohoes, NY (US); Xuelian Zhu, San Jose, CA (US); Lei Sun, Altamont, NY (US); Hui Zang, Guilderland, NM (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 15/791,650

(22) Filed: Oct. 24, 2017

(65) Prior Publication Data

US 2019/0123162 A1 Apr. 25, 2019

(51) Int. Cl.
*H01L 29/49* (2006.01)
*H01L 27/092* (2006.01)
(Continued)

(52) U.S. Cl.
CPC .......... *H01L 29/4975* (2013.01); *H01L 21/28* (2013.01); *H01L 21/823431* (2013.01);
(Continued)

(58) Field of Classification Search
CPC ......... H01L 21/76897; H01L 29/41775; H01L 29/66795; H01L 29/66477;
(Continued)

(56) References Cited

U.S. PATENT DOCUMENTS 9,054,178 B2   6/2015   Bohr et al.
9,397,003 B1   7/2016   Niimi et al.
(Continued)

FOREIGN PATENT DOCUMENTS

TW   201630073 A   8/2016
TW   201709422 A   3/2017
TW   201717278 A   5/2017

OTHER PUBLICATIONS

Office Action from related U.S. Appl. No. 15/791,711 dated Jul. 5, 2018.
(Continued)

*Primary Examiner* — Samuel A Gebremariam
*Assistant Examiner* — Jonas T Beardsley
(74) *Attorney, Agent, or Firm* — Amerson Law Firm, PLLC

(57) ABSTRACT

One illustrative method disclosed includes, among other things, selectively forming a gate-to-source/drain (GSD) contact opening and a CB gate contact opening in at least one layer of insulating material and forming an initial gate-to-source/drain (GSD) contact structure and an initial CB gate contact structure in their respective openings, wherein an upper surface of each of the GSD contact structure and the CB gate contact structure is positioned at a first level, and performing a recess etching process on the initial GSD contact structure and the initial CB gate contact structure to form a recessed GSD contact structure and a recessed CB gate contact structure, wherein a recessed upper
(Continued)

surface of each of these recessed contact structures is positioned at a second level that is below the first level.

18 Claims, 39 Drawing Sheets

(51) Int. Cl.
          *H01L 29/78*       (2006.01)
          *H01L 21/28*       (2006.01)
          *H01L 29/66*       (2006.01)
          *H01L 29/417*      (2006.01)
          *H01L 21/8234*     (2006.01)
          *H01L 27/088*      (2006.01)

(52) U.S. Cl.
          CPC .. *H01L 21/823475* (2013.01); *H01L 27/0886* (2013.01); *H01L 27/092* (2013.01); *H01L 29/41775* (2013.01); *H01L 29/66477* (2013.01); *H01L 29/783* (2013.01)

(58) Field of Classification Search
          CPC ......... H01L 21/16897; H01L 21/76877; H01L 29/41755
          See application file for complete search history.

(56) References Cited

U.S. PATENT DOCUMENTS

| | | | |
|---|---|---|---|
| 9,478,634 B2 | 10/2016 | Xie et al. | |
| 9,570,573 B1 | 2/2017 | Fan et al. | |
| 2008/0217775 A1* | 9/2008 | Pai | H01L 21/76877 |
| | | | 257/751 |
| 2014/0252464 A1 | 9/2014 | Sell et al. | |
| 2014/0349476 A1* | 11/2014 | Chen | H01L 21/76816 |
| | | | 438/620 |
| 2016/0336183 A1 | 11/2016 | Yuan et al. | |
| 2017/0221891 A1 | 8/2017 | Chen et al. | |
| 2017/0373161 A1 | 12/2017 | Schroeder | |

OTHER PUBLICATIONS

Examination Report from Taiwan Patent Application No. 107113832 dated Mar. 18, 2019.

* cited by examiner

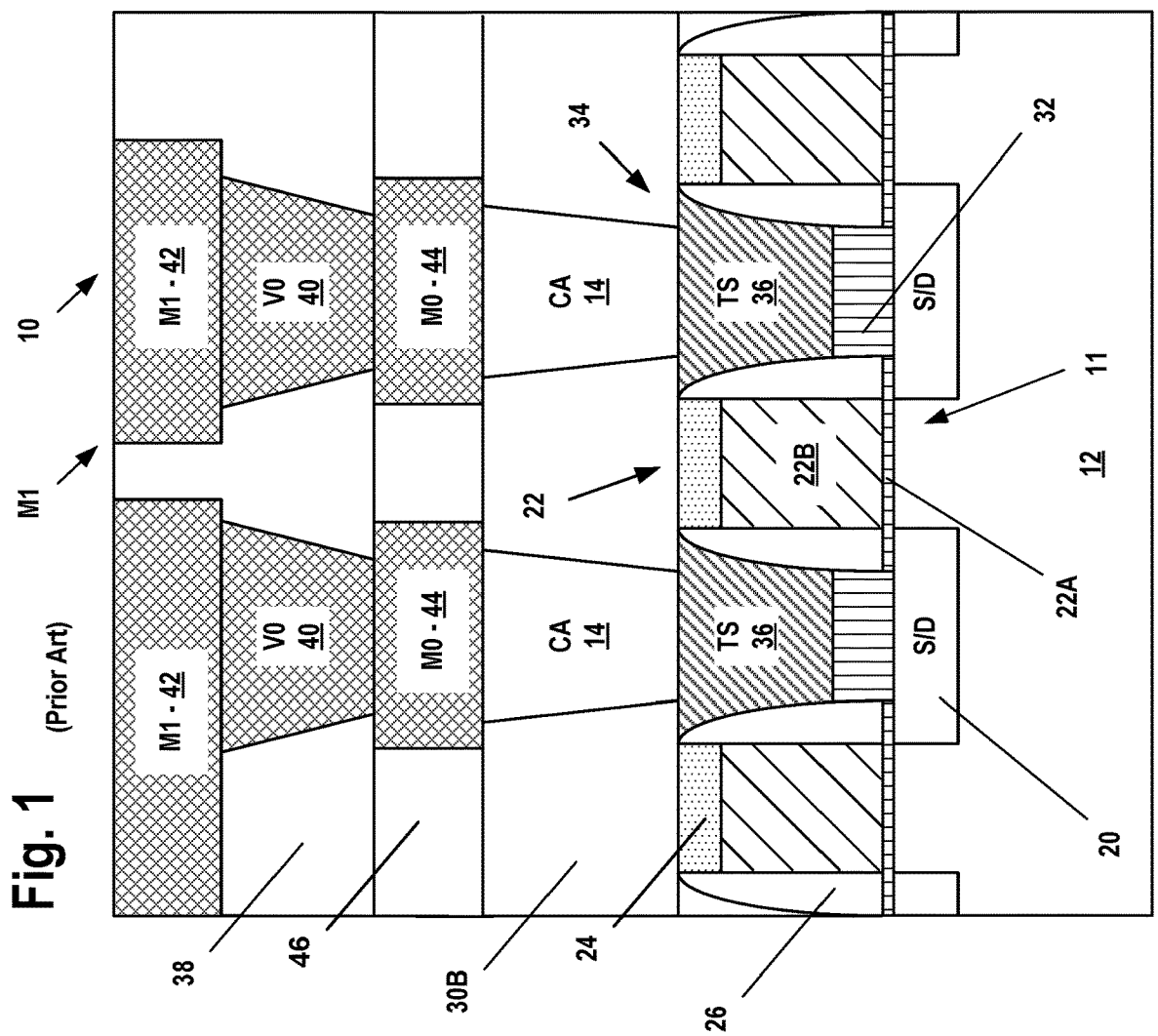
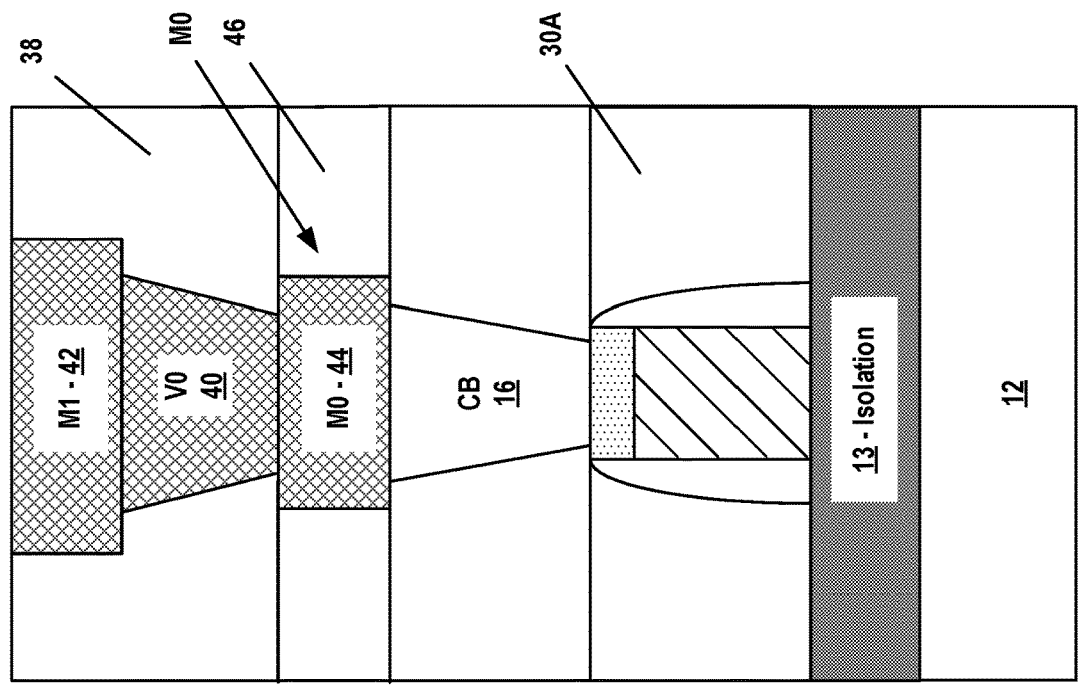
Fig. 1 (Prior Art)

METHODS OF FORMING GATE CONTACT STRUCTURES AND CROSS-COUPLED CONTACT STRUCTURES FOR TRANSISTOR DEVICES

BACKGROUND OF THE INVENTION

1. Field of the Invention

The present disclosure generally relates to the fabrication of integrated circuits, and, more particularly, to various novel methods of forming gate contact structures and cross-coupled contact structures for transistor devices and various novel device structures.

2. Description of the Related Art

In modern integrated circuits, such as microprocessors, storage devices and the like, a very large number of circuit elements, especially field effect transistors (FETs), are formed and operated on a restricted chip area. FETs come in a variety of different configurations, e.g., planar devices, FinFET devices, nanowire devices, etc. These FET devices are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region.

There are various device level contacts formed on an IC product to establish electrical connection to the various semiconductor devices formed on the substrate. For example, such device level contacts include a plurality of what are sometimes referred to as "CA contact" structures for establishing discrete electrical connection to each of the source/drain regions of a transistor device, and a discrete gate contact structure, which is sometimes referred to as a "CB contact" structure, for establishing discrete electrical connection to the gate structure of a transistor device. The CA contact structures typically contact what is sometimes referred to as a "trench silicide" (TS) structure that is formed above the source/drain region of the transistor device. The CB gate contact is typically positioned vertically above isolation material that surrounds the transistor device, i.e., the CB gate contact is typically not positioned above the active region, but it may be in some advanced architectures. The CB gate contact is typically positioned above the isolation region so as to avoid or reduce the chances of creating an electrical short between the CB contact and the TS conductive structures formed in the source/drain regions of the transistor, i.e., there is a minimum spacing that must be maintained between these two structures according to various design rules in an attempt to prevent such electrical shorts. Unfortunately, there is an area penalty associated with the requirement that the CB contact only be positioned above the isolation region. Accordingly, efforts have been made to create process flows whereby the CB contact is formed entirely over the active area.

However, in some applications, such as in SRAM circuits, it is necessary to form a conductive contact or conductive strap between the gate electrode of a transistor and one of the source/drain regions of that transistor, i.e., a gate-to-source/drain (GSD) contact structure. The GSD contact structure is sometimes referred to as a "cross-coupled" contact or a CAREC (a CA RECtangular) structure. The GSD contact structure creates an electrical short between the gate electrode of a first transistor and one of the source/drain regions of a second transistor. Of course, such cross-coupled contact structures may also be formed on other IC devices and in different applications other than SRAM circuits.

Typically, due to the large number of semiconductor devices (i.e., circuit elements such as transistors, resistors, capacitors, etc.) and the required complex layout of modern integrated circuits, the electrical connections or "wiring arrangement" for the individual semiconductor devices cannot be established within the same device level on which the semiconductor devices are manufactured. Accordingly, the various electrical connections that constitute the overall wiring pattern for the IC product are formed in a metallization system that comprises a plurality of stacked "metallization layers" that are formed above the device level of the product. These metallization layers are typically comprised of layers of insulating material with conductive metal lines and conductive vias formed in the layers of insulating material. Generally, the conductive lines provide the intra-level electrical connections, while the conductive vias provide the inter-level connections or vertical connections between different levels of the conductive lines. These conductive lines and conductive vias may be comprised of a variety of different materials, e.g., copper, tungsten, aluminum, etc. (with appropriate barrier layers). The first metallization layer in an integrated circuit product is typically referred to as the "M1" layer. Normally, a plurality of conductive vias (typically referred to as "V0" vias) are used to establish electrical connection between the M1 layer and lower level conductive structures that are generally referred to as device-level contacts (explained more fully below). In some more advanced devices, another metallization layer comprised of conductive lines (sometimes called the "M0" layer) is formed between the device level contacts and the V0 vias.

The formation of gate contact structures and GSD contact structures on modern IC products can be very challenging. The present disclosure is directed to various novel methods of forming gate contact structures and cross-coupled contact structures for transistor devices and various novel device structures on IC products.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel methods of forming gate contact structures and cross-coupled contact structures for transistor devices and various novel device structure. One illustrative method disclosed includes, among other things, selectively forming a gate-to-source/drain (GSD) contact opening and a CB gate contact opening in at least one layer of insulating material and forming an initial gate-to-source/drain (GSD) contact structure in the GSD contact opening and an initial CB gate contact structure in the CB gate contact opening, wherein an upper surface of each of the GSD contact structure and the CB gate contact structure is positioned at a first level. In one example, the method also includes performing a recess etching process on the initial GSD contact structure and the initial CB gate contact structure to form a recessed GSD contact structure and a recessed CB gate contact structure, wherein a recessed upper surface of each of the recessed GSD contact structure and the recessed CB gate contact structure is positioned at a second level that is below the first level.

One illustrative integrated circuit (IC) product disclosed herein includes a first conductive source/drain contact structure of a first transistor with an insulating source/drain cap positioned above at least a portion of an upper surface of the first conductive source/drain contact structure and a gate-to-source/drain (GSD) contact structure that is conductively coupled to the first conductive source/drain contact structure and a first gate structure of a second transistor. In this example, the product also includes a CB gate contact structure that is conductively coupled to a second gate structure of a third transistor, wherein an upper surface of each of the GSD contact structure and the CB gate contact structure is positioned at a first level that is at a level that is above a level of an upper surface of the insulating source/drain cap.

BRIEF DESCRIPTION OF THE DRAWINGS

The disclosure may be understood by reference to the following description taken in conjunction with the accompanying drawings, in which like reference numerals identify like elements, and in which:

FIGS. 1-2 depict various illustrative prior art arrangements of device-level contacts and metallization layers for an integrated circuit product.

Figure 2:
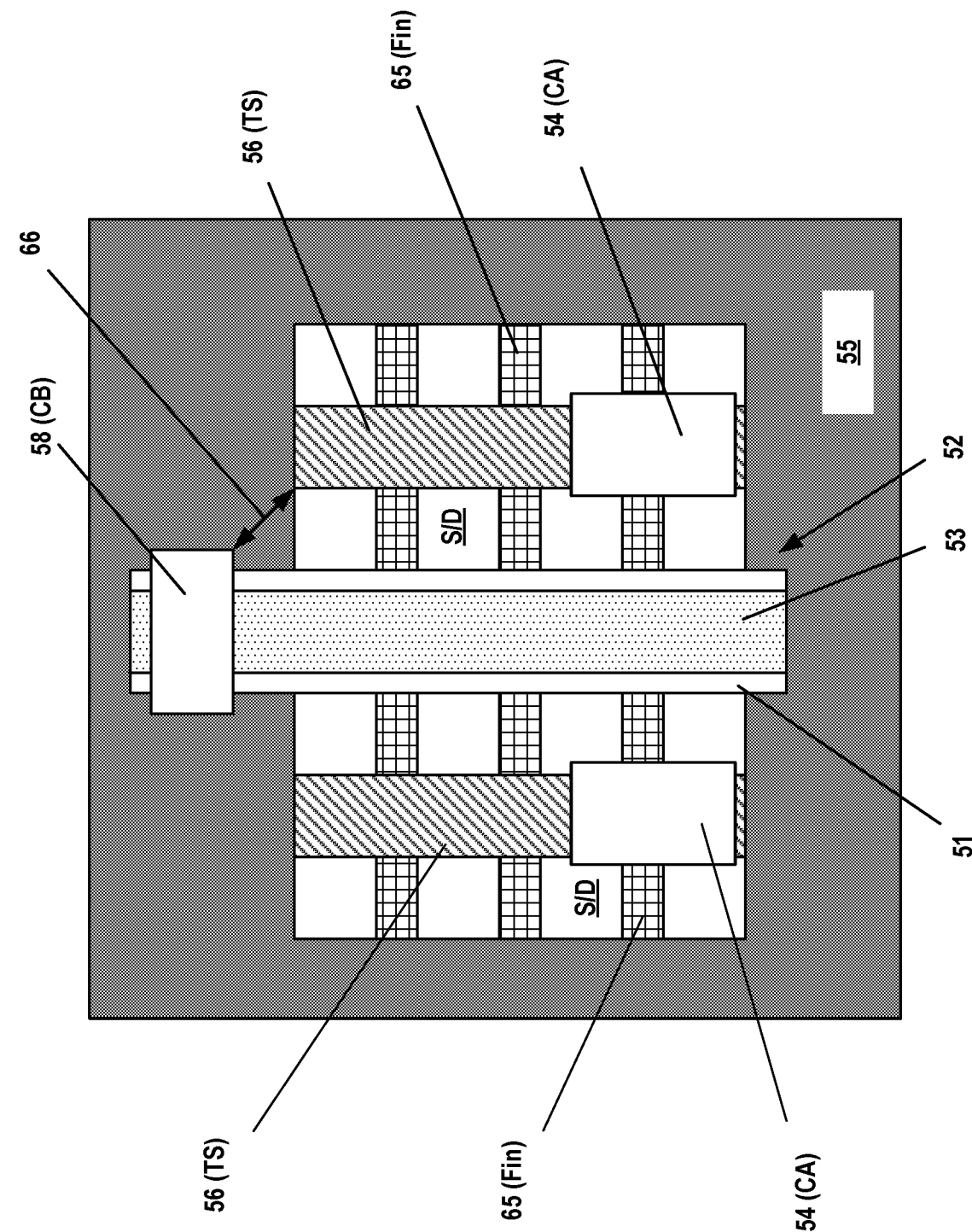

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

FIG. 1 is a cross-sectional view of an illustrative prior art IC product 10 comprised of a transistor device 11 formed in and above a semiconductor substrate 12. Also depicted are a plurality of CA contact structures 14 for establishing electrical connection to the simplistically depicted source/drain regions 20 of the device 11, and a CB gate contact structure 16. The CB gate contact 16 is typically positioned vertically above isolation material 13 that surrounds the device 11, i.e., the CB gate contact 16 is typically not positioned above the active region defined in the substrate 12, but it may be in some advanced architectures.

The transistor 11 comprises an illustrative gate structure 22 (i.e., a gate insulation layer 22A and a gate electrode 22B), a gate cap 24, a sidewall spacer 26 and simplistically depicted source/drain regions 20. At the point of fabrication depicted in FIG. 1, layers of insulating material 30A, 30B, i.e., interlayer dielectric materials, have been formed above the substrate 12. Other layers of material, such as contact etch stop layers and the like, are not depicted in the drawing. Also depicted are illustrative raised epi source/drain regions 32 and source/drain contact structures 34, which typically include a so-called "trench silicide" (TS) structure 36. The CA contact structures 14 may be in the form of discrete contact elements, i.e., one or more individual contact plugs having a generally square-like shape or cylindrical shape when viewed from above, that are formed in an interlayer dielectric material. In other applications, the CA contact structures 14 may also be a line-type feature that contacts underlying line-type features, e.g., the TS structure 36 that contacts the source/drain region 20 typically extends across the entire active region on the source/drain region 20 in a direction that is parallel to the gate width direction of the transistor 11, i.e., into and out of the plane of the drawing in FIG. 1. The CA contacts 14 and the CB contact 16 are all considered to be device-level contacts within the industry.

The IC product 10 includes an M0 metallization layer of the multi-level metallization system for the product 10. The M0 metallization layer is formed in a layer of insulating material 46, e.g., a low-k insulating material, and it is formed to establish electrical connection to the device-level contacts—CA contacts 14 and the CB contact 16. Also depicted in FIG. 1 is the M1 metallization layer for the product 10 that is formed in a layer of insulating material 38, e.g., a low-k insulating material. A plurality of conductive vias—V0 vias 40—is provided to establish electrical connection between the M0 metallization layer and the M1 metallization layer. Both the M0 metallization layer and the M1 metallization layer typically include a plurality of metal lines 44, 42 (respectively) that are routed as needed across the product 10. The formation of the M0 metallization layer may be helpful in reducing the overall resistance of the circuits formed on the substrate 12. However, in some IC products, the M0 metallization layer may be omitted and the V0 vias 40 of the M1 metallization layer make contact with the CA contacts 14 and the CB contact 16.

FIG. 2 is a simplistic plan view of a single FinFET transistor device 52. The transistor 52 comprises a plurality of illustrative fins 65, a gate cap layer 53, a sidewall spacer 51 and trench silicide structures 56 formed above the source/drain regions. Also depicted are a plurality of CA contact structures 54 for establishing electrical connection to the source/drain regions, and a CB gate contact structure 58 that is formed so as to establish electrical contact to the gate structure (not shown) by forming an opening in the gate cap 53.

As shown in FIG. 2, the CB gate contact 58 is typically positioned vertically above the isolation material 55 that surrounds the device 52, i.e., the CB gate contact 58 is typically not positioned above the active region, but it may be in some advanced architectures. The CB gate contact 58 is typically positioned above the isolation region 55 so as to avoid or reduce the chances of creating an electrical short between the CB contact 58 and the TS structure 56, i.e., there is a minimum spacing 66 that must be maintained between these two structures according to various design rules in an attempt to prevent such electrical shorts. Unfortunately, there is an area penalty associated with the requirement that the CB contact 58 only be positioned above the isolation region 55.

The present disclosure is directed to various novel methods of forming gate contact structures and cross-coupled contact structures for transistor devices and various novel device structures. The methods and devices disclosed herein may be employed in manufacturing products using a variety of technologies, e.g., NMOS, PMOS, CMOS, etc., and they may be employed in manufacturing a variety of different devices, e.g., memory products, logic products, ASICs, etc. As will be appreciated by those skilled in the art after a complete reading of the present application, the inventions disclosed herein may be employed in forming integrated circuit products using transistor devices in a variety of different configurations, e.g., planar devices, FinFET devices, nanowire devices, etc. In the illustrative examples depicted herein, the transistor devices will be FinFET devices. The gate structures for the transistor devices may be formed using either "gate first" or "replacement gate" manufacturing techniques. Thus, the presently disclosed inventions should not be considered to be limited to any particular form of transistors or the manner in which the gate structures of the transistor devices are formed. Of course, the inventions disclosed herein should not be considered to be limited to the illustrative examples depicted and described herein. With reference to the attached figures, various illustrative embodiments of the methods and devices disclosed herein will now be described in more detail. The various layers of material described below may be formed by any of a variety of different known techniques, e.g., a chemical vapor deposition (CVD) process, an atomic layer deposition (ALD) process, a thermal growth process, spin-coating techniques, etc. Moreover, as used herein and in the attached claims, the word "adjacent" is to be given a broad interpretation and should be interpreted to cover situations where one feature actually contacts another feature or is in close proximity to that other feature.

Figure 3:
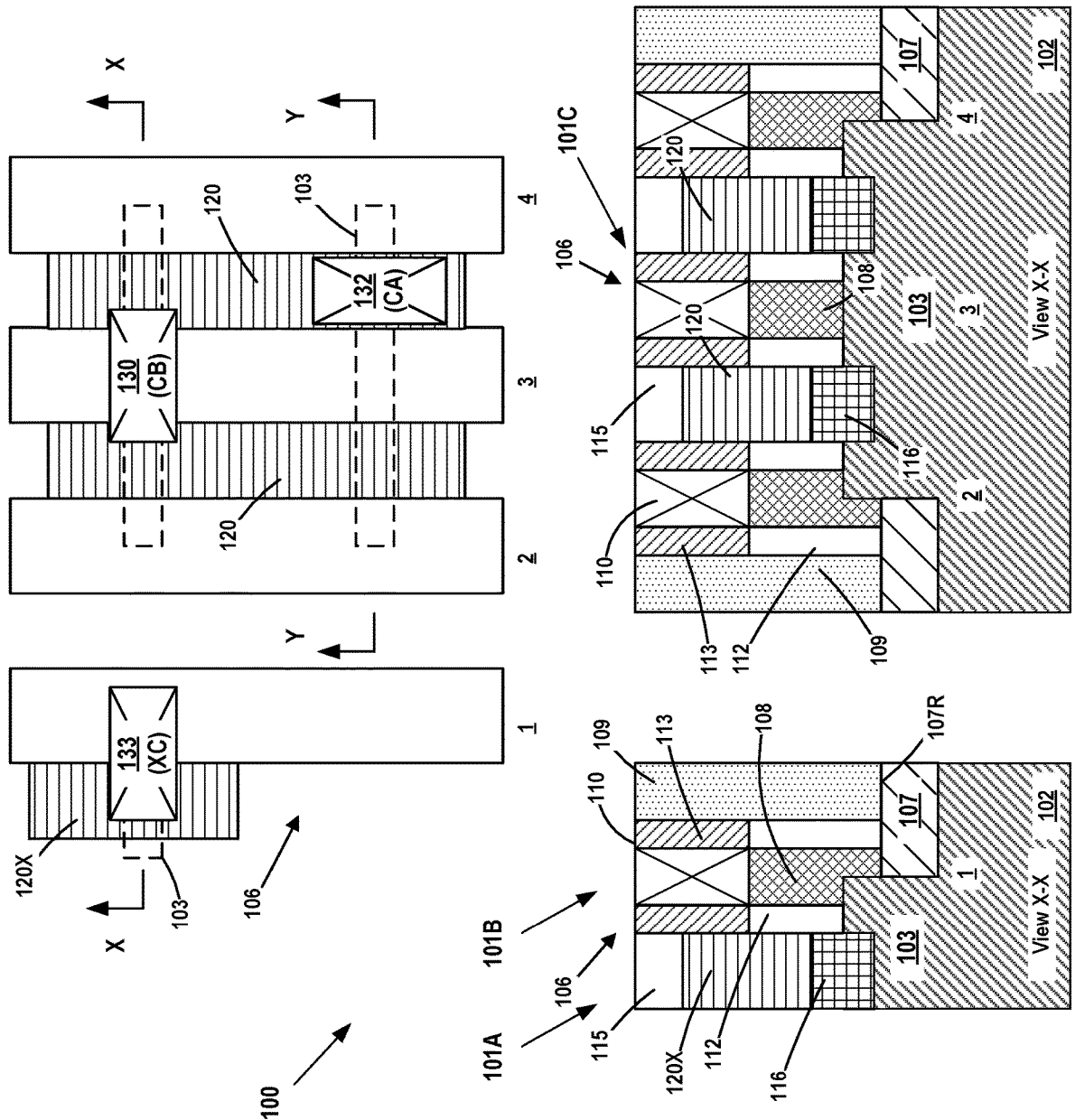
FIGS. 3-39 depict various novel methods disclosed herein of forming gate contact structures and cross-coupled contact structures for transistor devices and various novel device structures.

FIGS. 3-15 depict various novel methods disclosed herein for forming gate contact structures and cross-coupled contact structures for transistor devices on an integrated circuit (IC) product 100 and the resulting novel structures. In the depicted example, the IC product 100 comprises first, second and third transistors 101A, 101B, 101C, respectively, and a plurality of gates 106 (numbered 1-4 for ease of reference) for the various transistor devices that are formed in and above a semiconductor substrate 102. Also depicted in the plan view are illustrative source/drain contact structures 120, 120X (e.g., trench silicide structures) that are conductively coupled to the source/drain regions of the transistor devices. The illustrative source/drain contact structure 120X is part of the first transistor 101A (the gate for the first transistor 101A is not shown), gate 1 is the active gate for the second transistor 101B and gate 3 is the active gate for the third transistor 101C. Gates 2 and 4 are "dummy" or inactive gates as it relates to the third transistor 101C, but gates 2 and 4 may be active gates for other transistor devices (not shown) that are formed above the substrate 102. FIG. 3 also includes a simplistic plan view of the IC product 100 with various layers of insulating material removed. As shown more fully below, among other aspects disclosed herein, a GSD (cross-coupled) contact 133 will be formed between the source/drain region 120X of the first transistor 101A and the conductive gate electrode of the gate structure 108 of the second transistor 101B.

In the illustrative example depicted herein, the transistor devices are FinFET devices, but the inventions disclosed herein should not be considered to be limited to IC products that include FinFET transistor devices as the various inventions disclosed herein may be employed when manufacturing other forms of transistors, such as planar transistor devices. At the point of processing depicted in FIG. 3, a plurality of fins 103 have been formed in the substrate 102 using traditional manufacturing techniques, and the gates 106 have been formed across the fins 103. The plan view also depicts where an illustrative CB gate contact structure 130 will be formed to contact the gate structure 108 of gate 3. The CB gate contact structure 130 disclosed herein will be positioned above the active region of the transistor. As used herein, the term "active region" should be understood to be the area or "footprint" occupied by the two conductive source/drain contact structures 120 that are positioned on opposite sides of gate 3 as well as the portion of gate number 3 that is positioned between the two source/drain contact structures 120. Also shown in the plan view in FIG. 3 is the location where a CA contact structure 132 will be formed to contact one of the source/drain contact structures 120 of the third transistor 101C. Also shown is the location where a gate-to-source/drain (GSD) contact structure 133 will be formed to conductively couple the gate electrode of the gate structure 108 of gate 1 of the second transistor 101B to the source/drain contact structure 120X that is part of the first transistor 101A.

The drawings included herein also include two cross-sectional drawings ("X-X" and "Y-Y") that are taken where indicated in the plan view in FIG. 3. More specifically, the cross-sectional view X-X is taken through the gates 106 in a gate-length direction of the transistor devices at a location where the CB gate contact structure 130 and the GSD contact structure 133 will be formed (and where densely packed gate contact structures 151 (not shown) will be formed for other transistor devices, as described more fully below). In the case where the transistor devices are FinFET devices, the view X-X should be understood to be a cross-sectional view taken through the long axis of a fin 103 of the transistors in a direction that corresponds to the gate length (current transport) direction of a FinFET device. The cross-sectional view Y-Y is taken through the gates 106 in a gate-length direction of the transistor devices at a location where the CA contact structure 132 will be formed.

The substrate 102 may have a variety of configurations, such as the depicted bulk silicon configuration. The substrate 102 may also have a semiconductor-on-insulator (SOI) configuration that includes a bulk semiconductor layer, a buried insulation layer and an active semiconductor layer positioned on the buried insulation layer, wherein semiconductor devices are formed in and above the active layer. The substrate 102 may be made of silicon or it may be made of materials other than silicon. Thus, the terms "substrate" or "semiconductor substrate" should be understood to cover all semiconducting materials and all forms of such materials. Additionally, various doped regions, e.g., halo implant regions, well regions and the like, are not depicted in the attached drawings.

FIG. 3 depicts the IC product 100 after several process operations were performed. First, as noted above, the fins 103 were formed by performing one or more etching processes, e.g., anisotropic etching processes, through a patterned fin-formation etch mask (not shown) to form a plurality of fin-formation trenches in the substrate 102 and thereby form the plurality of fins 103. The width and height of the fins 103 may vary depending upon the particular application. Additionally, the overall size, shape and configuration of the fin-formation trenches and fins 103 may vary depending on the particular application. Next, a layer of insulating material 107 (e.g., silicon dioxide) was then deposited so as to overfill the fin-formation trenches. A chemical mechanical polishing (CMP) process was then performed to planarize the upper surface of the layer of insulating material 107 with the upper surface of the fins 103, thereby removing the patterned fin-formation hard mask. Next, a recess etching process was performed on the layer of insulating material 107 such that it has a recessed upper surface 107R that exposes a desired amount of the fins 103 above the recessed upper surface 107R.

Still with reference to FIG. 3, after the layer of insulating material 107 was recessed, the gates 106 were formed above the fins 103. Each of the gates 106 includes a schematically depicted final gate structure 108, a final gate cap 110, a first sidewall spacer 112 and a second sidewall spacer 113. The sidewall spacers 112, 113 and the gate caps 110 may be comprised of a variety of different materials, such as silicon nitride, SiNC, SiN, SiCO, SiNOC, etc. In one illustrative embodiment, the first spacer 112 and the gate cap 110 may be made of the same material, e.g., silicon nitride, while the second spacer 113 may be made of a different material, e.g., SiCO, that exhibits good etch selectivity relative to the material of the first spacer 112 and the gate cap 110. Typically, when the gate structures 108 are manufactured using known replacement gate manufacturing techniques, a sacrificial gate structure (not shown) will be formed above the substrate 102 along with an original gate cap (not shown) positioned above the sacrificial gate structure. At that point, the first spacer 112 may be formed adjacent the sacrificial gate structure and the original gate cap. Next, prior to the formation of the final gate structures 108, epi semiconductor material 116 was formed on the exposed portions of the active regions 103 (or fins in the case of a FinFET device), i.e., in the source/drain regions of the devices, by performing an epitaxial growth process. The epi material 116 may be formed to any desired thickness. However, it should be understood that the epi material 116 need not be formed in all applications. Other layers of material, such as contact etch stop layers and the like, are not depicted in the drawings. Also depicted are illustrative source/drain contact structures 120, 120X which typically include a so-called "trench silicide" (TS) structure (not separately shown). As depicted, when the product 100 is completely manufactured, the upper surface of the source/drain contact structures 120, 120X is typically approximately level with the upper surface of the gate caps 110.

After formation of the epi material 116, a layer of insulating material 109 (e.g., silicon dioxide) was blanket-deposited across the substrate 102. Thereafter a CMP process was performed to planarize the layer of insulating material 109 using the original gate caps (not shown) positioned above the sacrificial gate structures as a polish stop layer. At that point, an etching process was performed so as to remove the original gate caps and a vertical portion of the first spacers 112 so as to expose the upper surface of the sacrificial gate structure for removal. Then, traditional replacement gate manufacturing processes were performed to remove the sacrificial gate structures so as to define replacement gate cavities between the spacers 112 where the final gate structures 108 will be formed. The final gate structures 108 are formed by sequentially depositing various layers of material into the replacement gate cavities and performing a CMP process to remove the portions of the gate materials positioned outside of the gate cavities. Thereafter, the materials for the gate structure 108 were recessed so as to make room for the second spacer 113 and the gate caps 110. Next, the second spacers 113 were formed as internal spacers in the space above the recessed gate materials by depositing a conformal layer of spacer material and performing an anisotropic etching process. Then, the gate caps 110 were formed by depositing a layer of spacer material in the space above the recessed gate materials and between the second spacers 113 and then performing a CMP process. Next, portions of the insulating material 109 above the source/drain regions were removed and the above-referenced source/drain contact structures 120, 120X were formed in the source/drain regions of the devices. Then, a recess etching process was performed on the source/drain contact structures 120, 120X to make room for an insulating source/drain cap 115 to be formed above each of the source/drain contact structures 120, 120X. The insulating source/drain cap 115 may be formed by depositing a layer of insulating material, e.g., silicon dioxide, SiC, SiCO, etc., above the recessed source/drain contact structures 120, 120X and then performing a CMP process.

Figure 4:
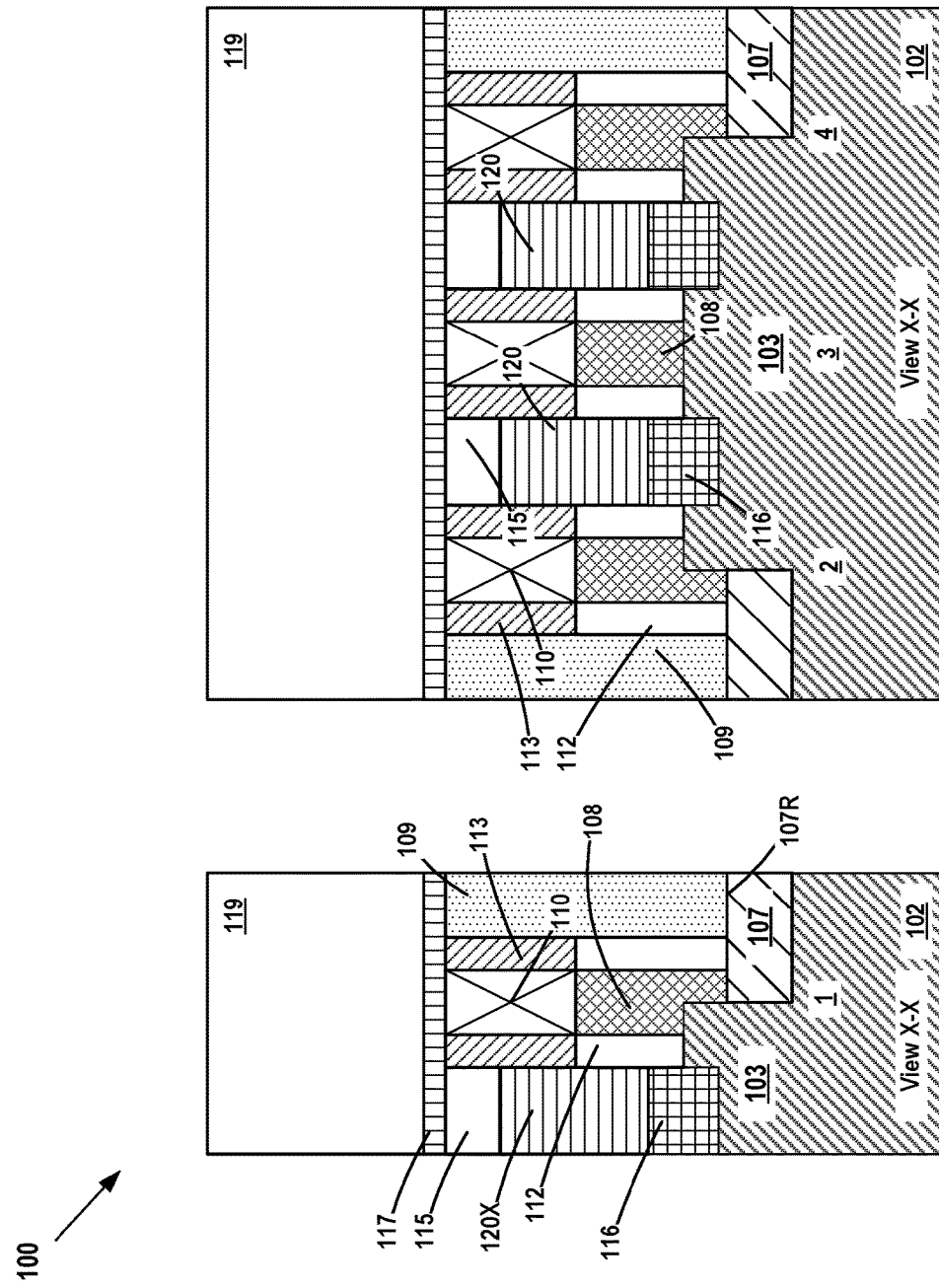

FIG. 4 depicts the IC product 100 after an etch stop layer 117 and a layer of insulating material 119 were formed above the product 100 by performing separate blanket deposition processes. The material of construction as well as the thickness of the layers 117, 119 may vary depending upon the particular application. In one illustrative embodiment, the etch stop layer 117 may comprise silicon nitride, while the layer of insulating material 119 may comprise silicon dioxide.

Figure 5:
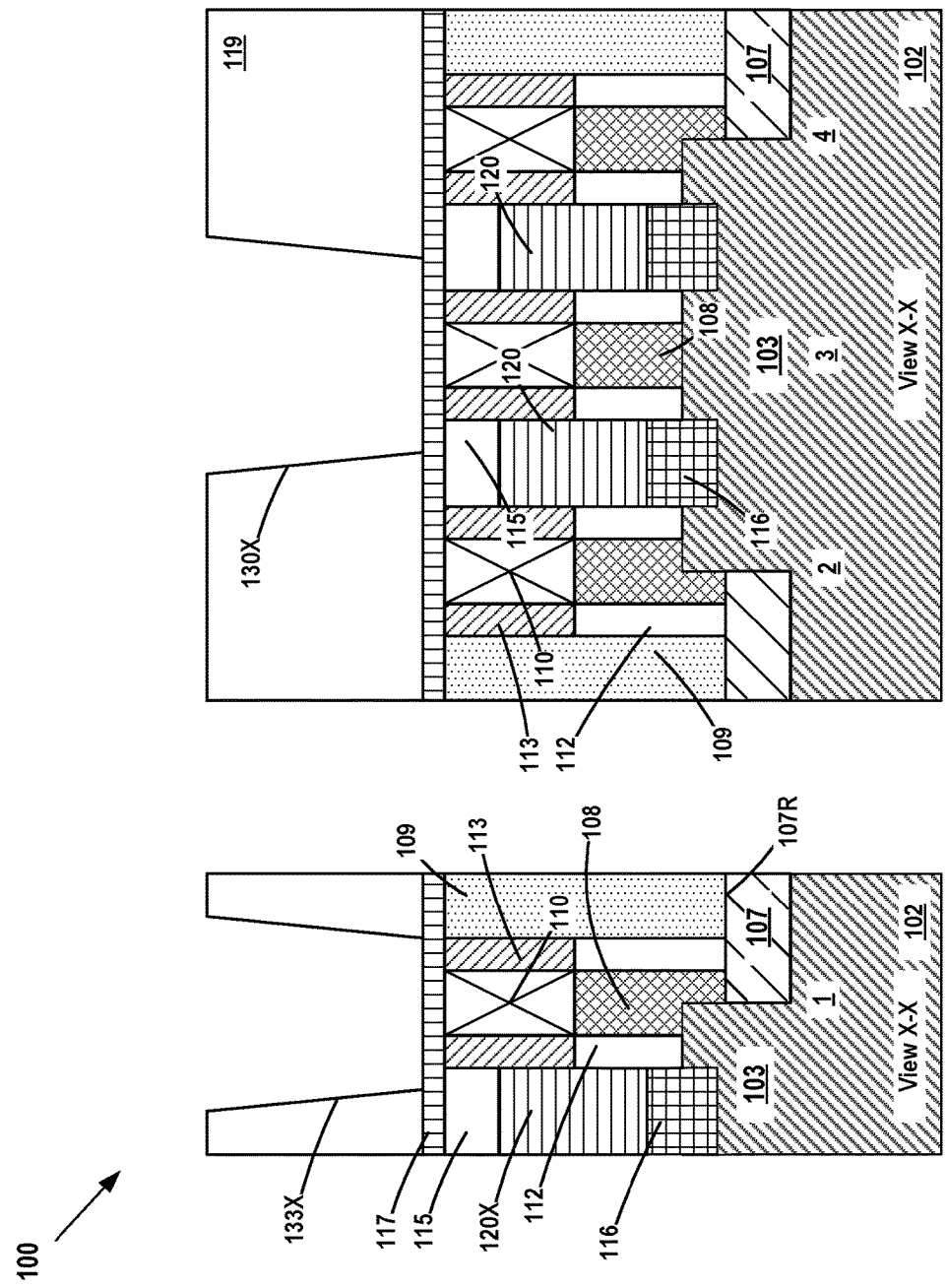

FIG. 5 depicts the product after openings 133X and 130X were formed in the layer of insulating material 119 for the GSD contact structure 133 and the CB gate contact structure 130, respectively. The openings 133X and 130X were formed by forming a patterned etch mask (not shown), e.g., a patterned layer of photoresist, above the layer of insulating material 119, and thereafter performing an etching process. As depicted, the etching process stops on the etch stop layer 117.

Figure 6:
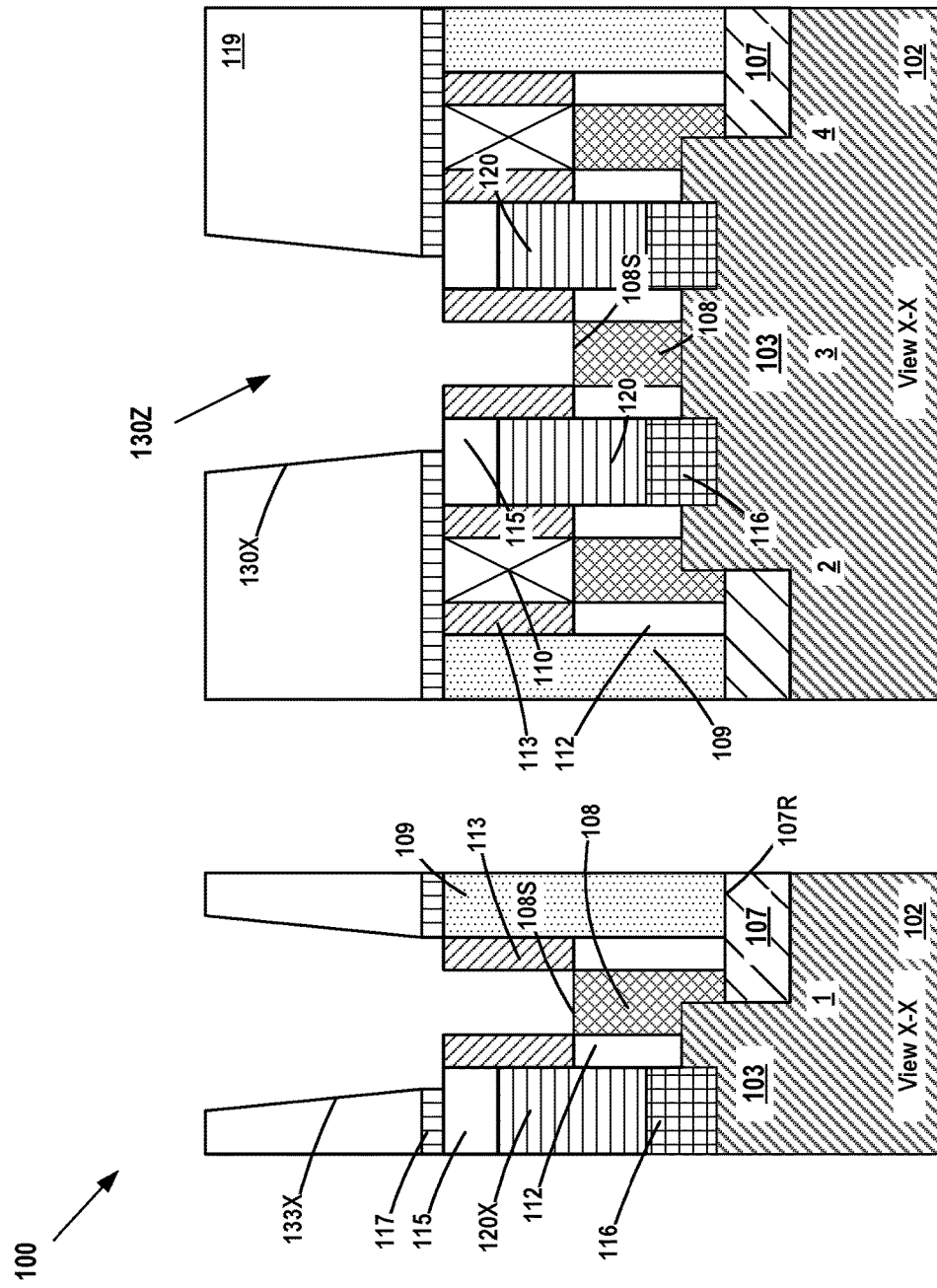

FIG. 6 depicts the product 100 after an etching process was performed through the openings 133X, 130X to selectively remove the exposed portions of the etch stop layer 117 as well as the gate caps 110 for gates 1 and 3 relative to the surrounding materials. This process operation exposes the upper surface 108S of the gate structures 108 of gates 1 and 3. Note that, during this etching process, the second spacers 113 and the insulating source/drain cap 115 protect the source/drain contact structures 120, 120X. This process operation also forms a CB gate contact opening 130Z for the CB gate contact structure 130.

Figure 7:
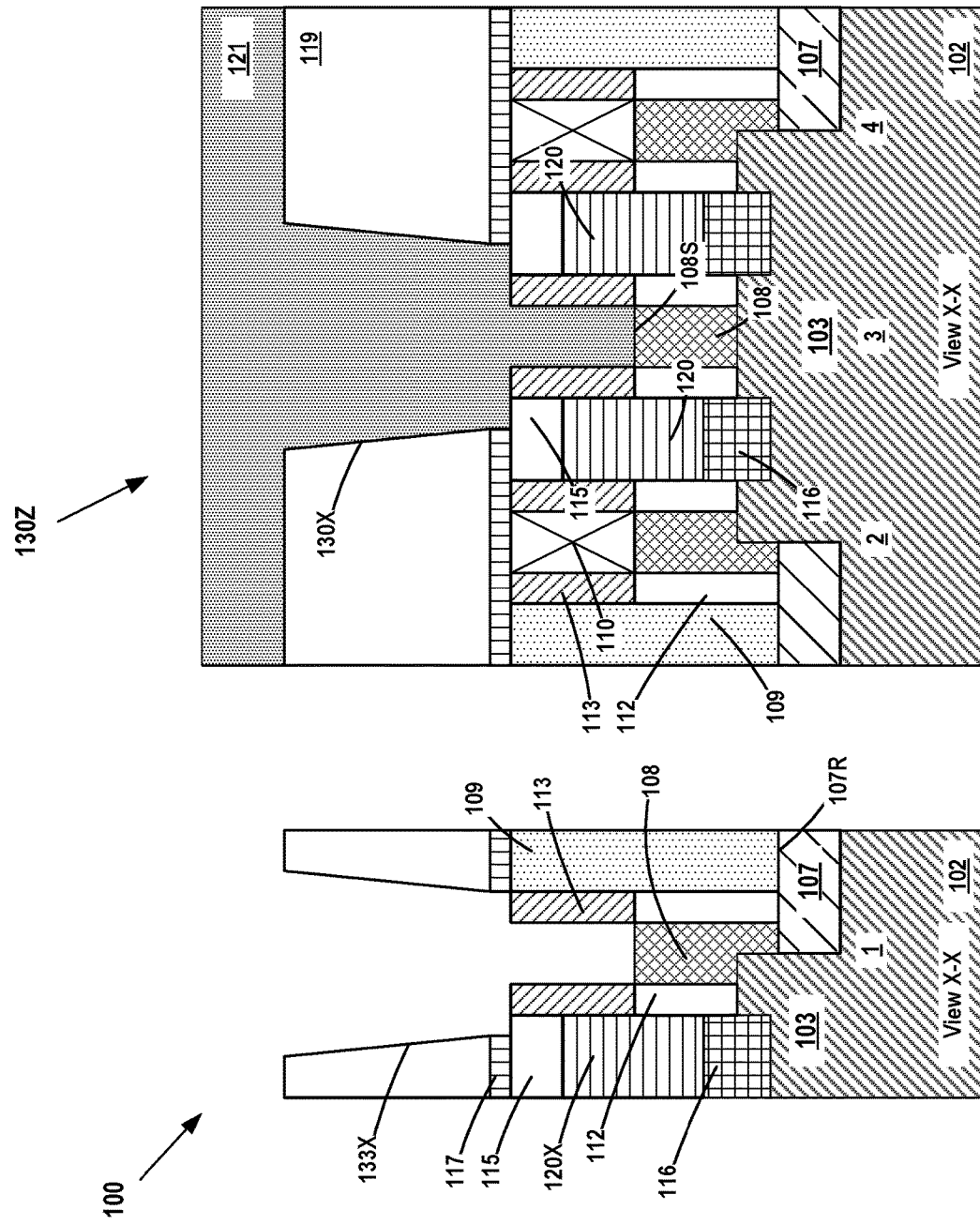

FIG. 7 depicts the product 100 after a sacrificial masking layer 121, e.g., a patterned layer of OPL, was formed so as to fill and cover the CB gate contact opening 130Z. As depicted, the masking layer 121 leaves gate 1 exposed for further processing.

Figure 8:
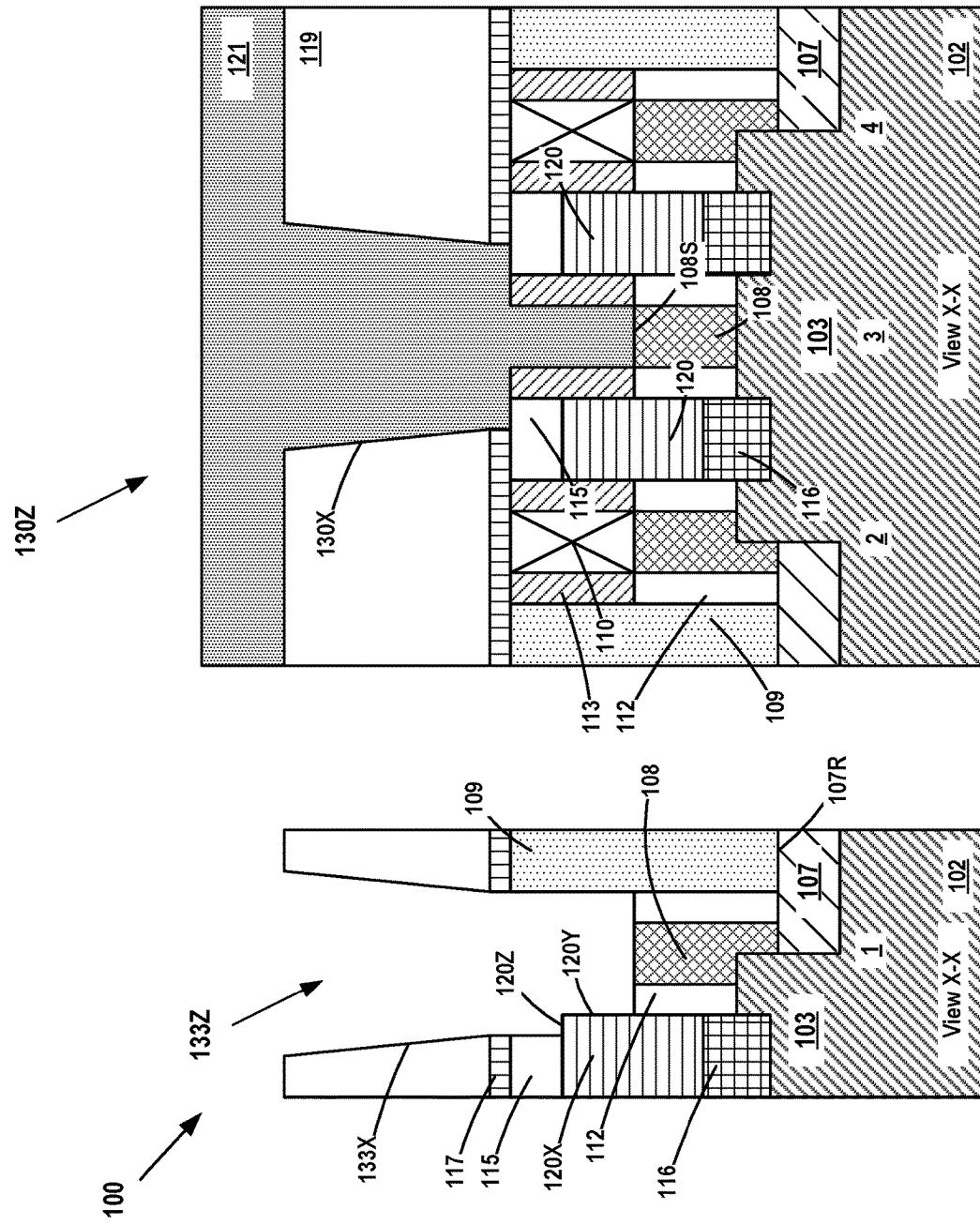

FIG. 8 depicts the product 100 after several process operations were performed. First, in one illustrative process flow, an etching process was performed to selectively remove at least the portion of the second sidewall spacer 113 positioned adjacent the source/drain contact structure 120X of the first transistor device 101A and thereby expose a portion of a side surface 120Y of the source/drain contact structure 120X. Thereafter, if desired, an optional etching process may be performed to selectively remove the exposed portion of the insulating source/drain cap 115 so as to expose a portion of the recessed upper surface 120Z of the source/drain contact structure 120X. If both etching processes are performed, they may be performed in any desired order. This process operation also forms a GSD contact opening 133Z for the GSD contact structure 133. In this illustrative process flow, the GSD contact opening is formed after the CD gate contact opening 130Z.

Figure 9:
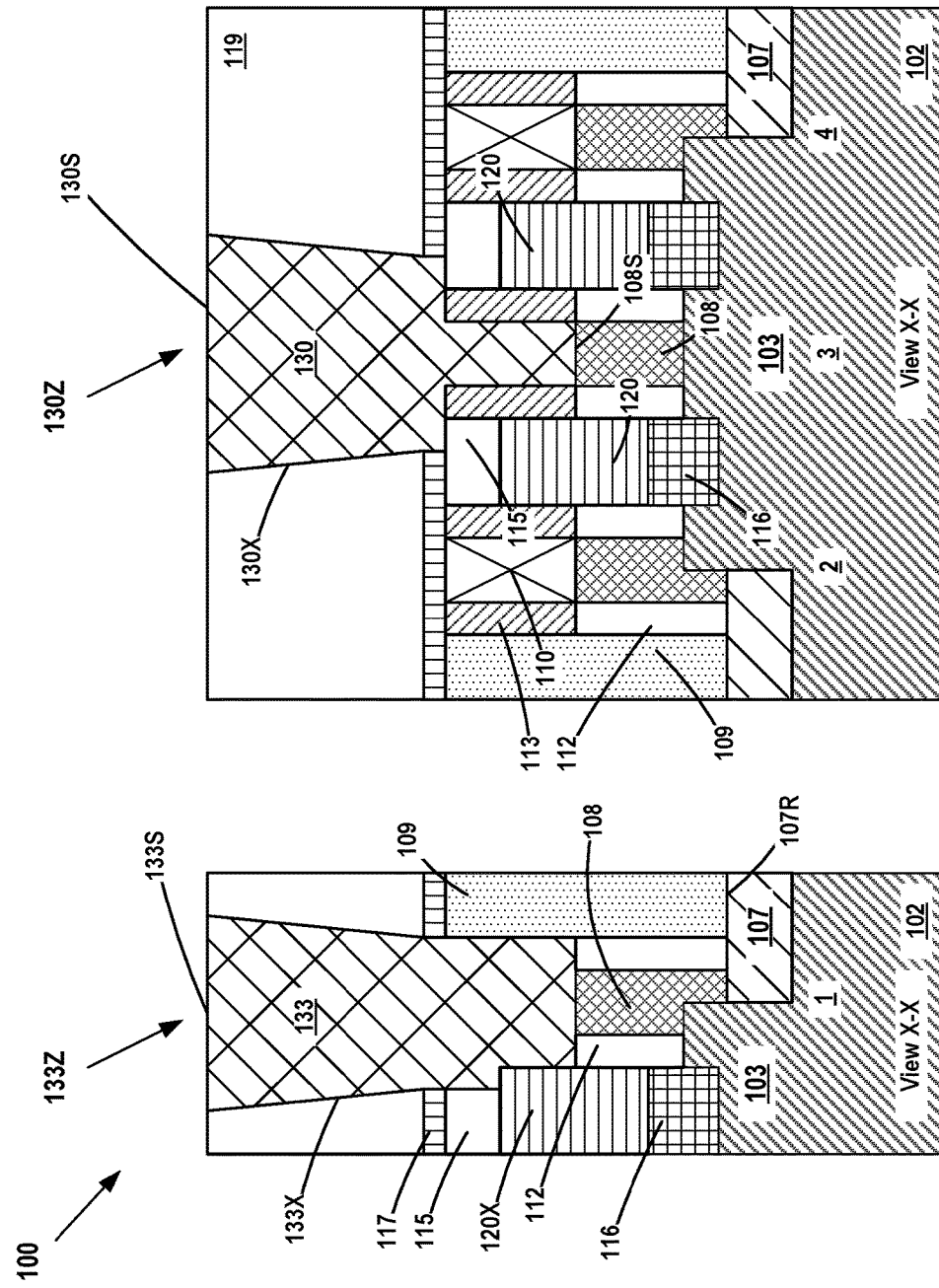

FIG. 9 depicts the product after several process operations were performed. First, the masking layer 121 was removed so as to re-expose the CB gate contact opening 130Z. Thereafter, the initial conductive CB gate contact structure 130 and the initial conductive GSD contact structure 133 were formed in the CB gate contact opening 130Z and the GSD contact opening 133Z, respectfully, by performing several process operations at the same time, i.e., several common process operations. In one illustrative process flow, the conductive materials for the conductive CB gate contact structure 130 and the conductive GSD contact structure 133 (e.g., including conformal barrier layers (not shown) and any bulk conductive material layers) were deposited in the openings 130Z and 133X. Thereafter, one or more CMP process operations were performed to remove excess amounts of the conductive materials positioned outside of the openings 130Z, 133Z using the insulating material 119 as a polish-stop. The conductive CB gate contact structure 130 and the conductive GSD contact structure 133 may comprise a variety of conductive materials, e.g., tungsten, copper, etc. As initially formed, the initial conductive CB gate contact structure 130 has an upper surface 130S and the initial conductive GSD contact structure 133 has an upper surface 133S that are substantially planar with an upper surface of the layer of insulating material 119, and the upper surfaces 130S, 133S are positioned at a common first level above the substrate 102.

Figure 10:
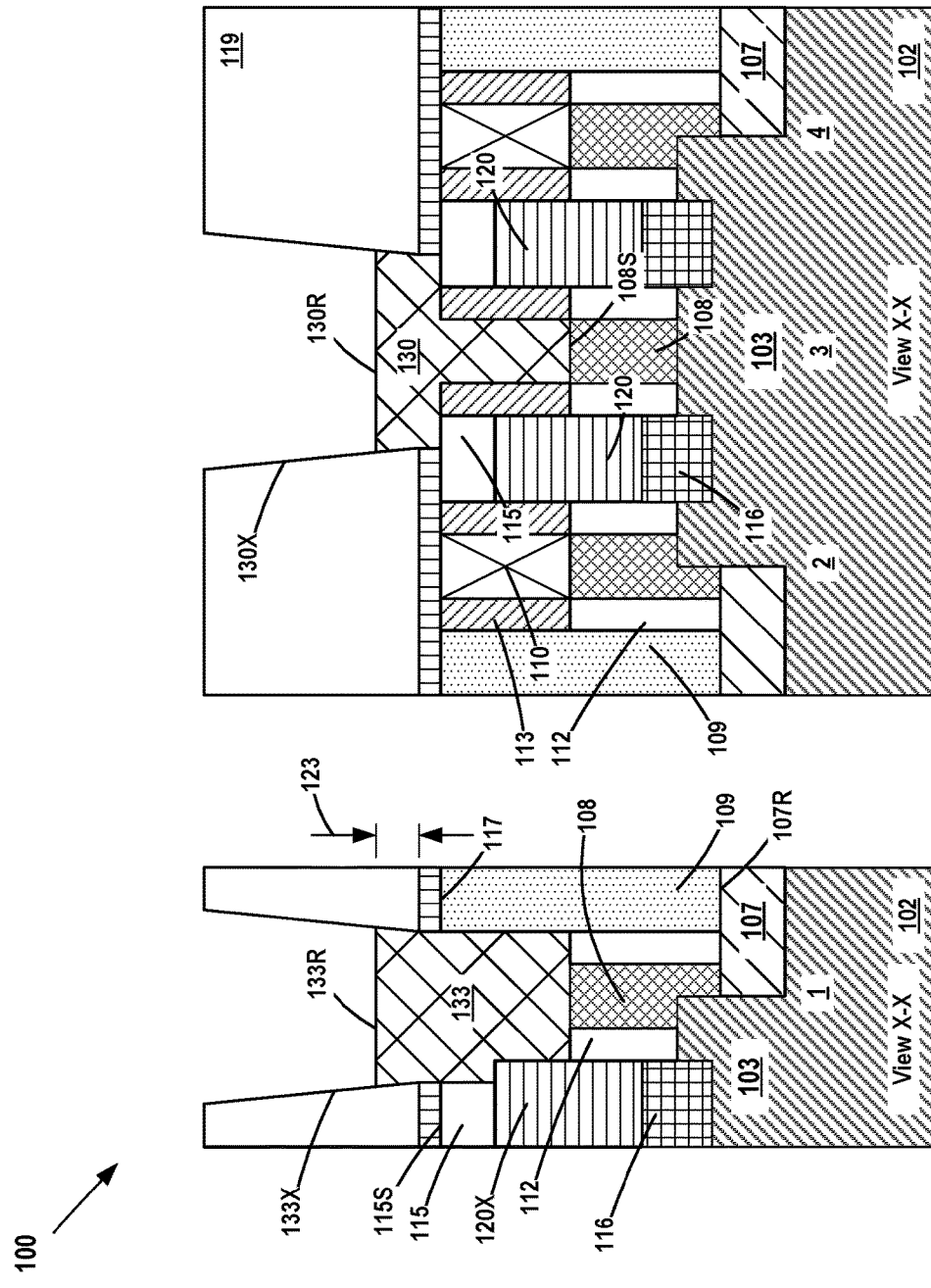

FIG. 10 depicts the product 100 after a recess etching process was performed on the conductive CB gate contact structure 130 and the conductive GSD contact structure 133 at the same time. This process operation forms a recessed conductive CB gate contact structure 130 and a recessed conductive GSD contact structure 133 that have a post-etch recessed upper surface 130R, 133R, respectively. The amount of recessing may vary depending upon the particular application. In one illustrative embodiment, the recess etching process should leave the recessed upper surfaces 130R, 133R positioned at a level that is a given distance 123, e.g., at least about 5 nm, above the etch stop layer 117. Moreover, after the recess etching process is completed, recessed upper surfaces 130R, 133R are positioned at a second level that is below the above-described first level and above a level of the upper surface 115S of the insulating source/drain cap 115.

Figure 11:
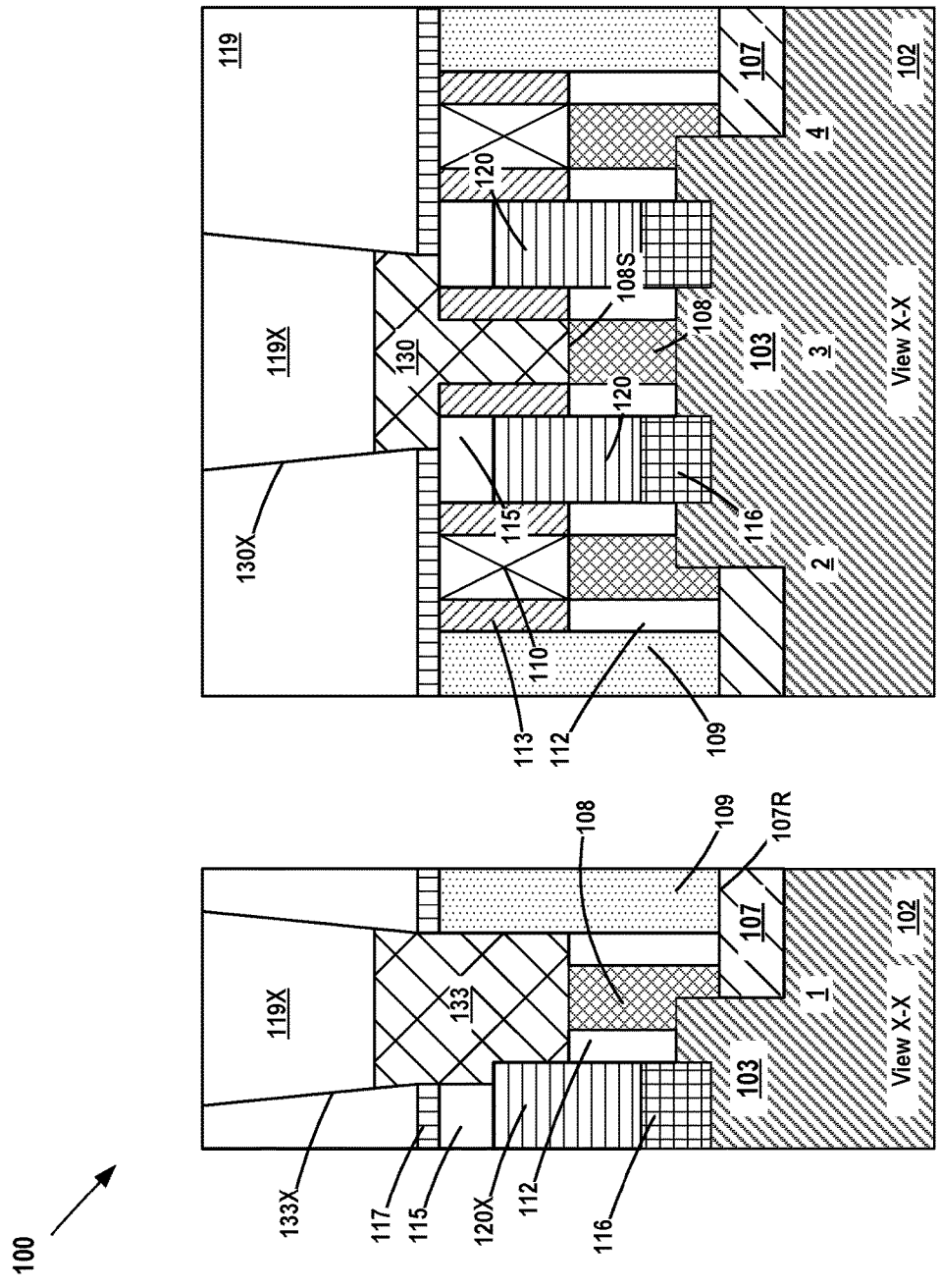

FIG. 11 depicts the product 100 after additional insulating material 119X was formed in the remaining portions of the openings 130X, 133X, above the conductive CB gate contact structure 130 and the conductive GSD contact structure 133, respectively. The additional insulating material 119X may be formed by depositing a layer of insulating material, e.g., silicon dioxide, so as to over-fill the openings 130X and 133X and then performing a CMP process. The additional insulating material 119X may be made of the same material as that of the insulating material 119, but that may not be the case in all applications.

Figure 12:
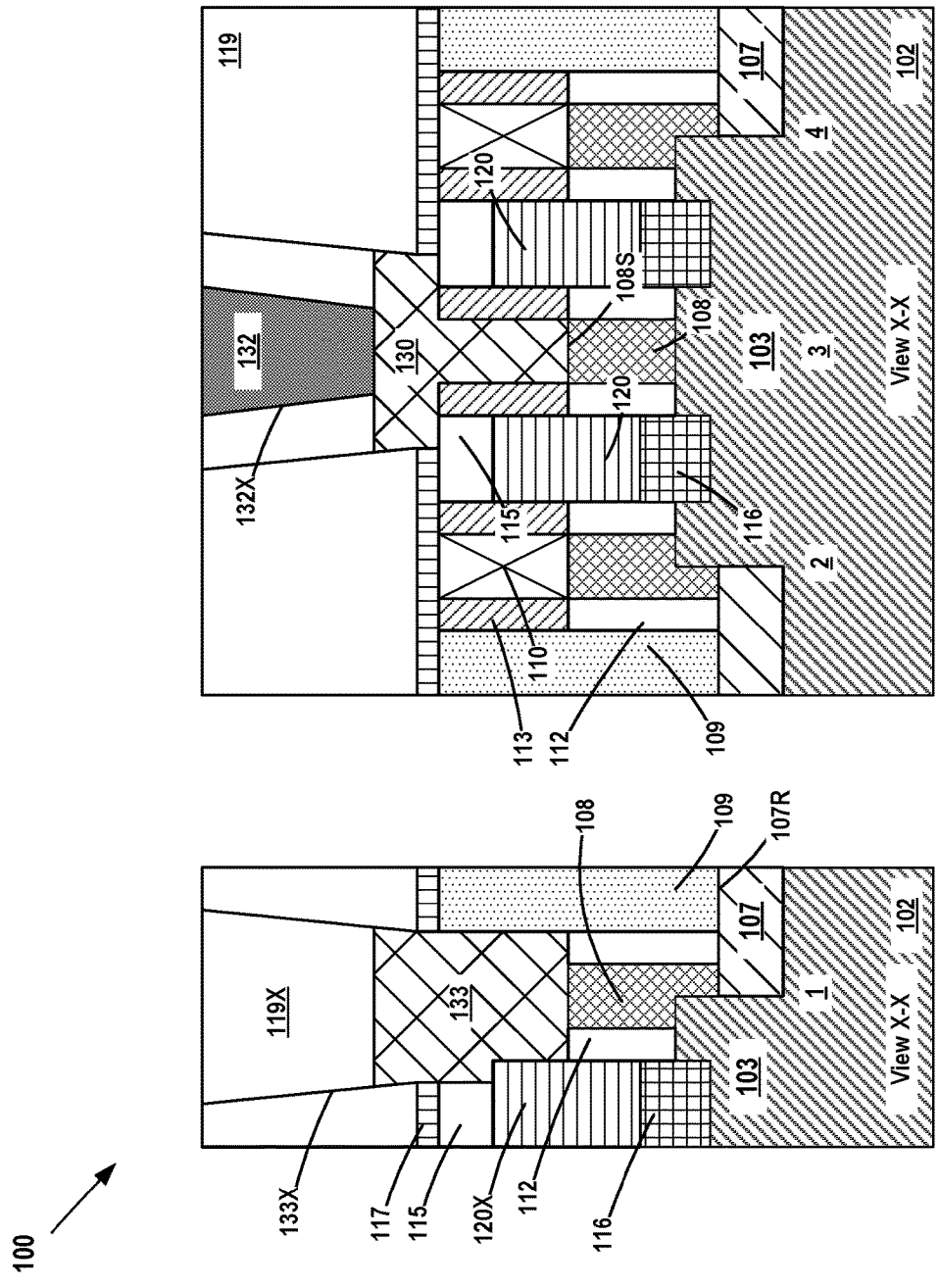
Figure 13:
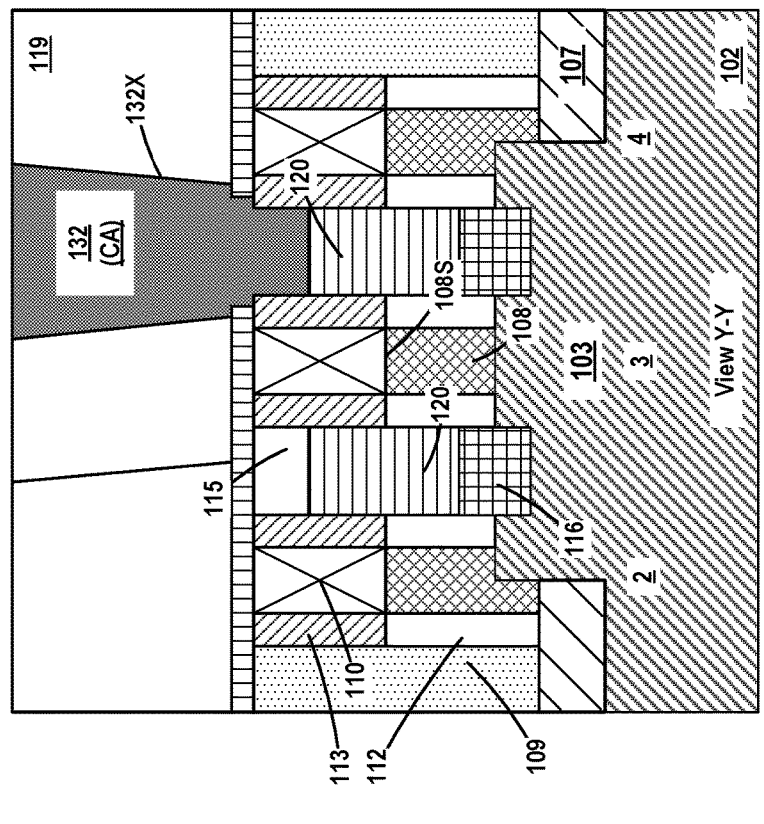

FIGS. 12 and 13 (view Y-Y (see FIG. 3)) depict the product 100 after several process operations were performed to form conductive contacts 132 to the source/drain contact structures 120 for the various transistor devices formed above the substrate 102. In the depicted example, one of the conductive contacts 132 is formed to conductively contact one of the source/drain contact structures 120 of the third transistor 101C. However, during the illustrative process flow depicted herein, as shown in FIG. 12, another conductive contact 132 was also formed that is conductively coupled to the recessed conductive CB gate contact structure 130. The conductive contacts 132 are intended to be representative in nature, as they may be formed using a variety of techniques and materials, e.g., copper, tungsten, a metal-containing material. First, in one illustrative process flow, a plurality of contact openings 132X were formed in the insulating materials 119, 119X. Next, one or more conformal barrier layers and/or seed layers (not separately shown) were formed so as to line the openings 132X with the barrier material(s). Next, a layer of conductive material (e.g., copper, a metal-containing material, a metal compound, etc.) was then formed on the product 100 so as to overfill the openings 132X. At that point, a CMP process was performed to remove excess portions of the conductive materials from above the upper surface of the layers of insulating materials 119, 119X. These process operations result in the formation of a conductive contact 132 that is conductively coupled to the gate structure 108 of gate 3 of the third transistor 101C and a conductive contact 132 that is conductively coupled to one of the source/drain contact structures 120 of the third transistor 101C.

Figure 14:
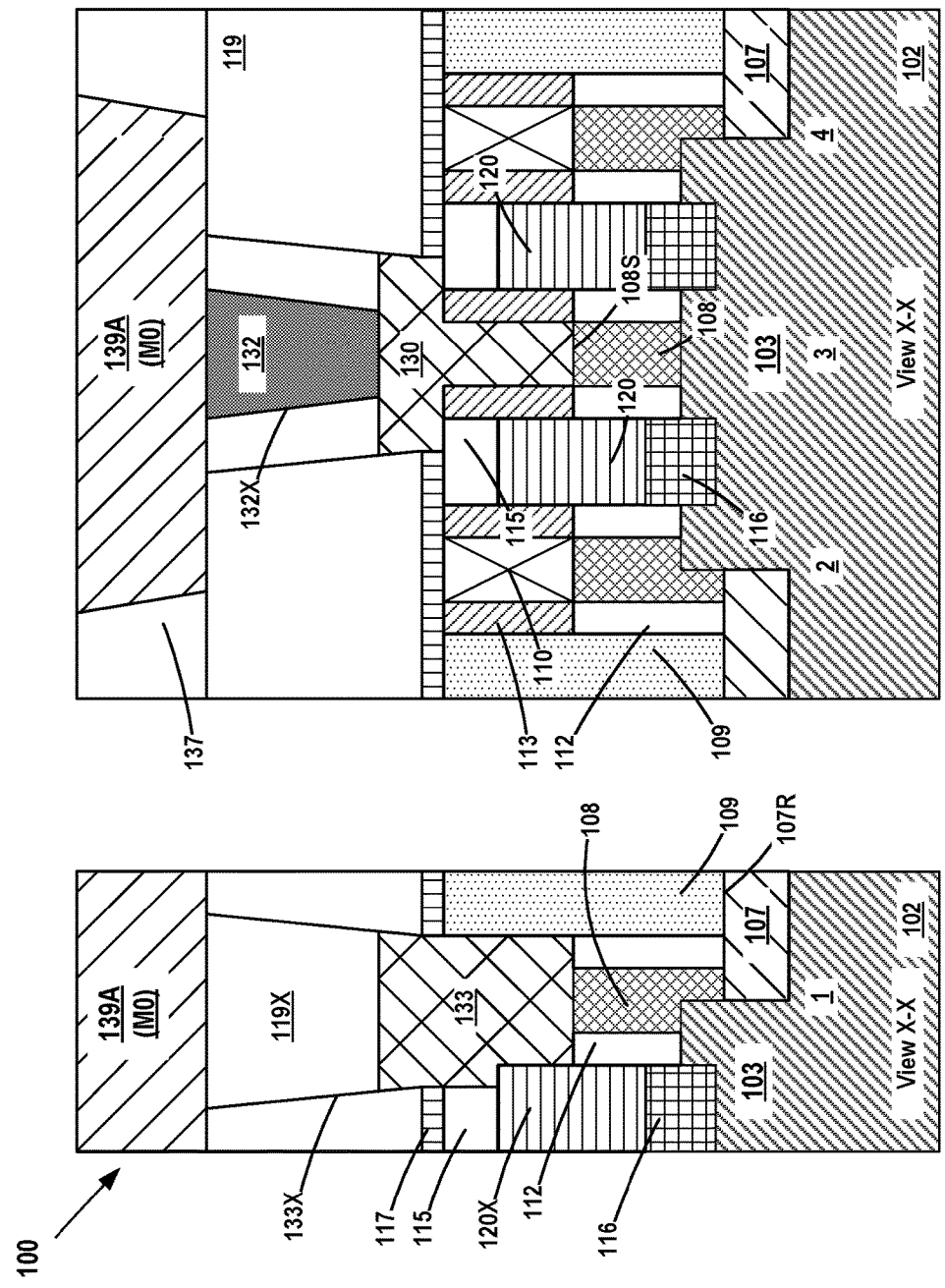
Figure 15:
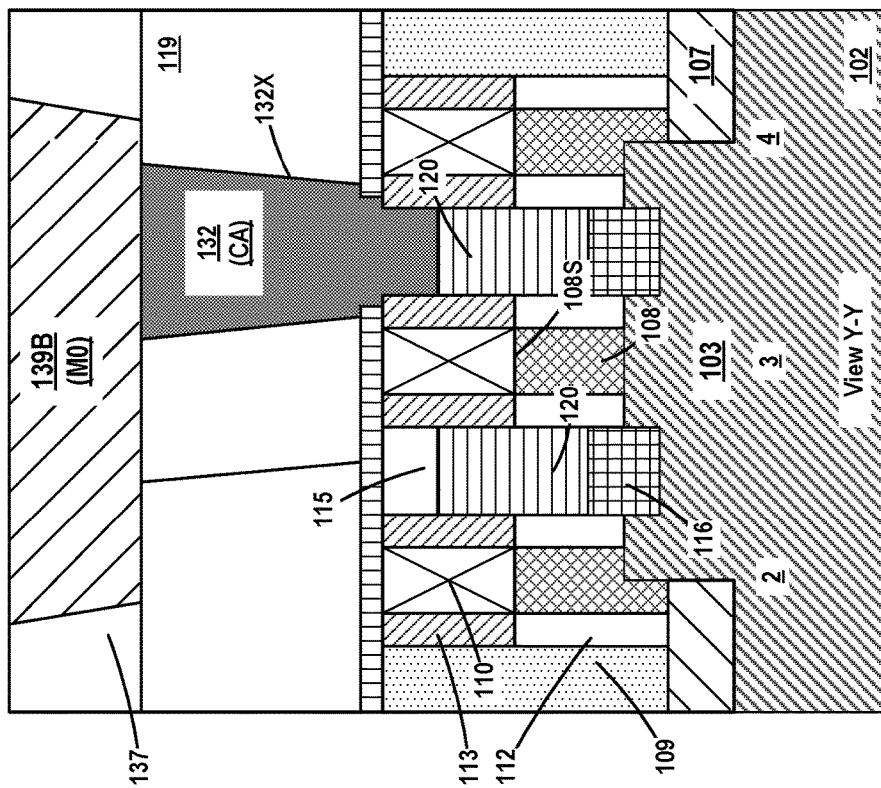

FIGS. 14 and 15 depict the product 100 after several process operations were performed to form a conductive M0 metallization layer above the product 100. The M0 metallization layer is comprised of a plurality of separate conductive lines 139A, 139B (collectively referenced using the reference numeral 139). First, a layer of insulating material 137 was formed above the product 100. Then, various openings for the conductive metal lines 139 were formed in the insulating material 137. Thereafter, the conductive materials for the conductive metal lines 139 were formed in the openings in the layer of insulating material 137. As depicted, the metal line 139A is conductively coupled to the conductive contact 132 that is coupled to the CB gate contact 130, while the conductive line 139B is conductively coupled to the conductive contact 132 that is coupled to a source/drain contact structure 120 of the third transistor. Note that, as shown in FIG. 14, due to the recessing of the GSD contact structure 133, the metal line 139A is physically (vertically) spaced-apart from the recessed GSD contact structure 133 (with insulating material being positioned between these two structures) thereby providing physical room to position the conductive line 139A vertically above the GSD contact structure 133. Stated another way, using the novel methods disclosed herein, by forming the recessed GSD contact structure 133, the metal line 139A is not blocked as it would be if the GSD contact structure 133 was not recessed. In one illustrative process flow, the metal lines 139 may be formed using techniques similar to those described above with respect to the formation of the conductive contacts 132.

Figure 16:
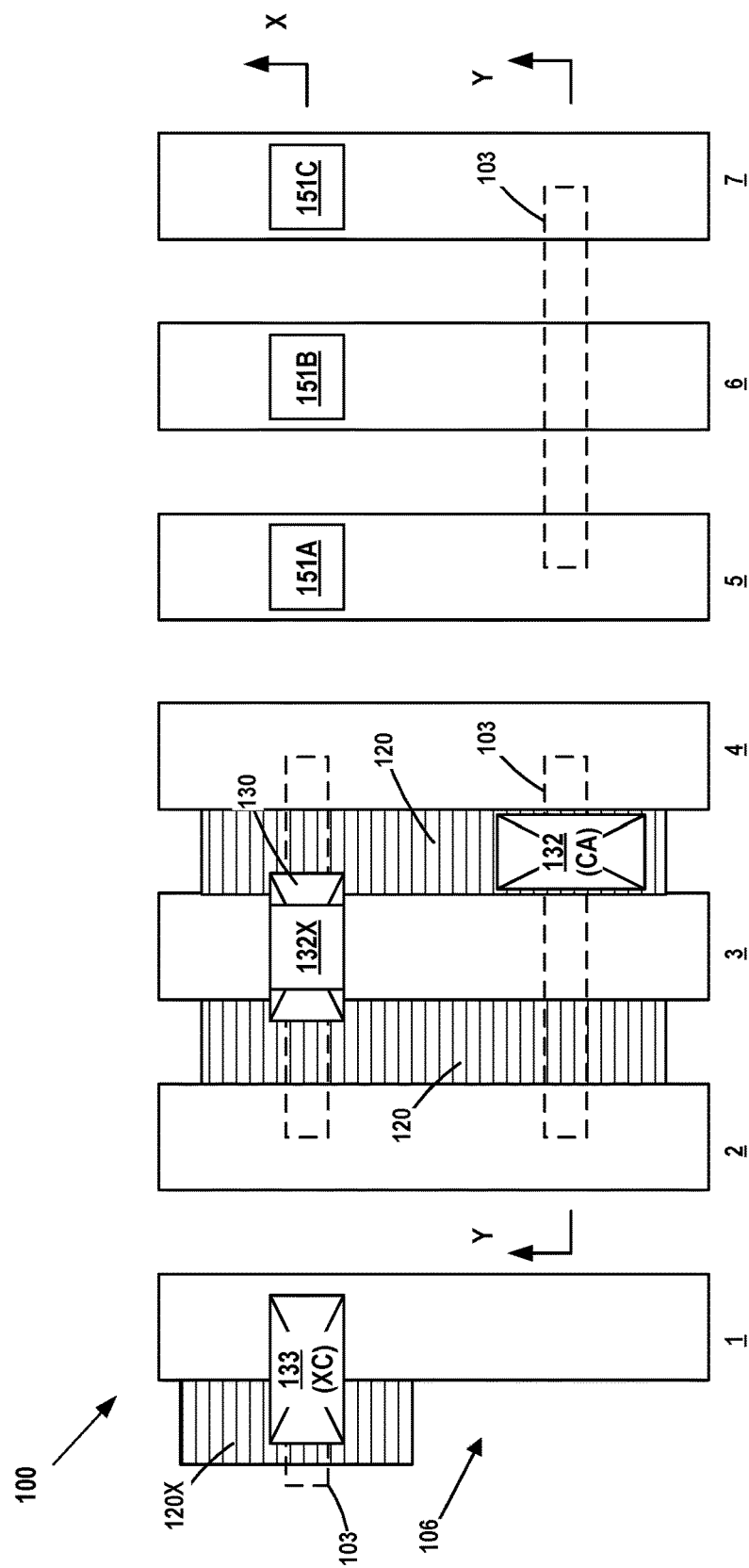

FIGS. 16-39 depict various other novel methods disclosed herein for forming gate contact structures and cross-coupled (or GSD) contact structures for transistor devices and various novel device structures. FIG. 16 is a simplistic plan view of an IC product 100 that includes additional gates 5-7 of other transistor devices formed above the substrate 102. In this example, closely spaced separate CB gate contact structures 151A, 151B and 151C (collectively referenced using the reference numeral 151) will be formed that will be conductively coupled to the gate structures 108 of gates 5, 6 and 7, respectively. In the depicted example, the CB gate contact structures 151 will be formed above isolation material, i.e., the CB gate contact structures 151 will not be formed above the active region of those transistor devices. Also note that, in the depicted example, due to the fact that each of the CB gate contact structures 151 is positioned immediately adjacent another CB gate contact structure 151 on immediately adjacent gate structures, such an arrangement may be referred to as densely packed CB gate contact structures. However, as will be appreciated by those skilled in the art after a complete reading of the present application, the various inventions disclosed herein should not be considered to be limited to situations wherein the IC product 100 includes such densely packed CB gate contact structures. For example, the presently disclosed inventions may be employed in situations where the CB gate contact structures 151 are not densely packed, i.e., when adjacent CB gate contact structures 151 in the same line or row are formed on every other one of the gates instead of every gate.

Figure 17:
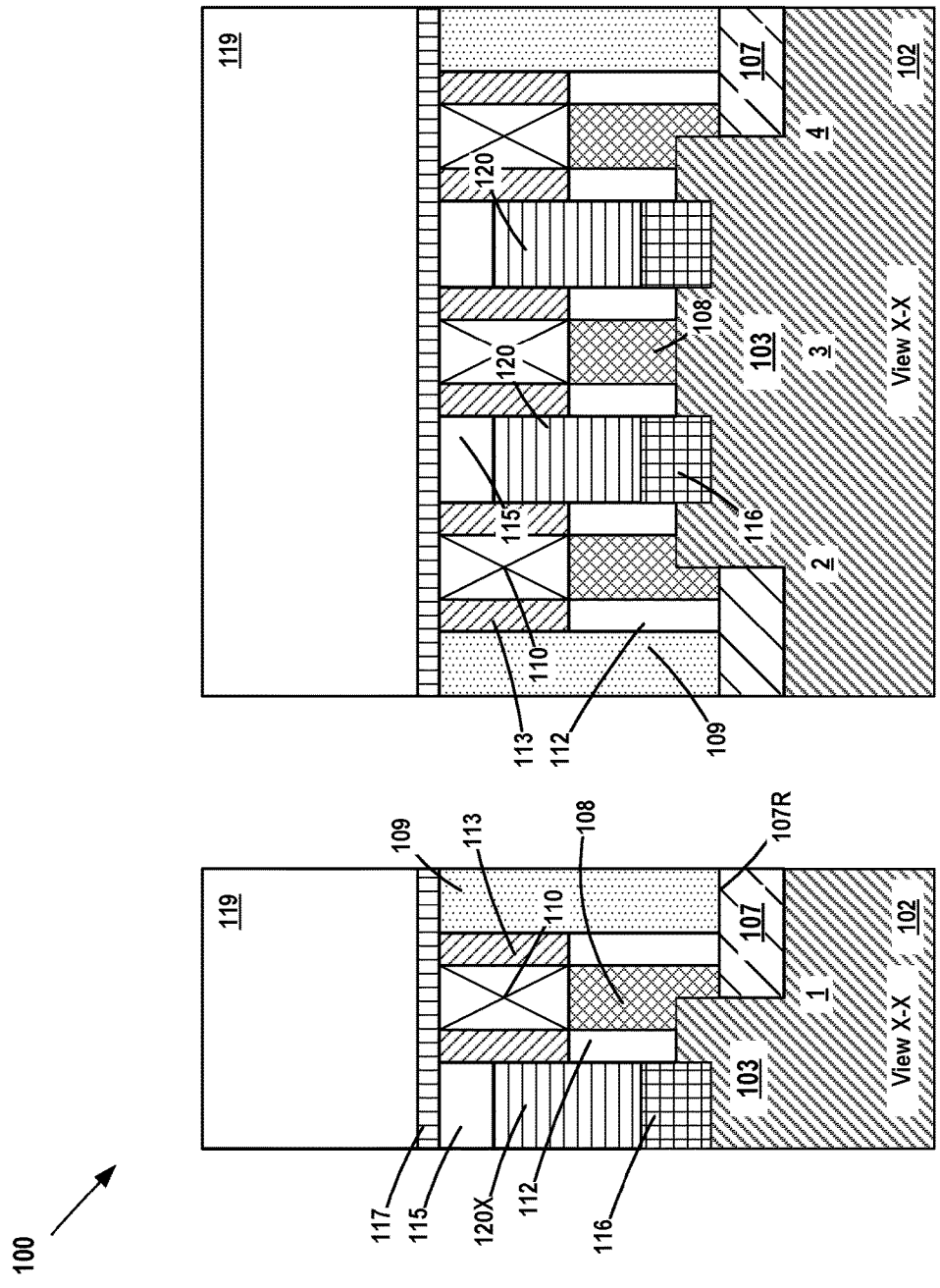
Figure 18:
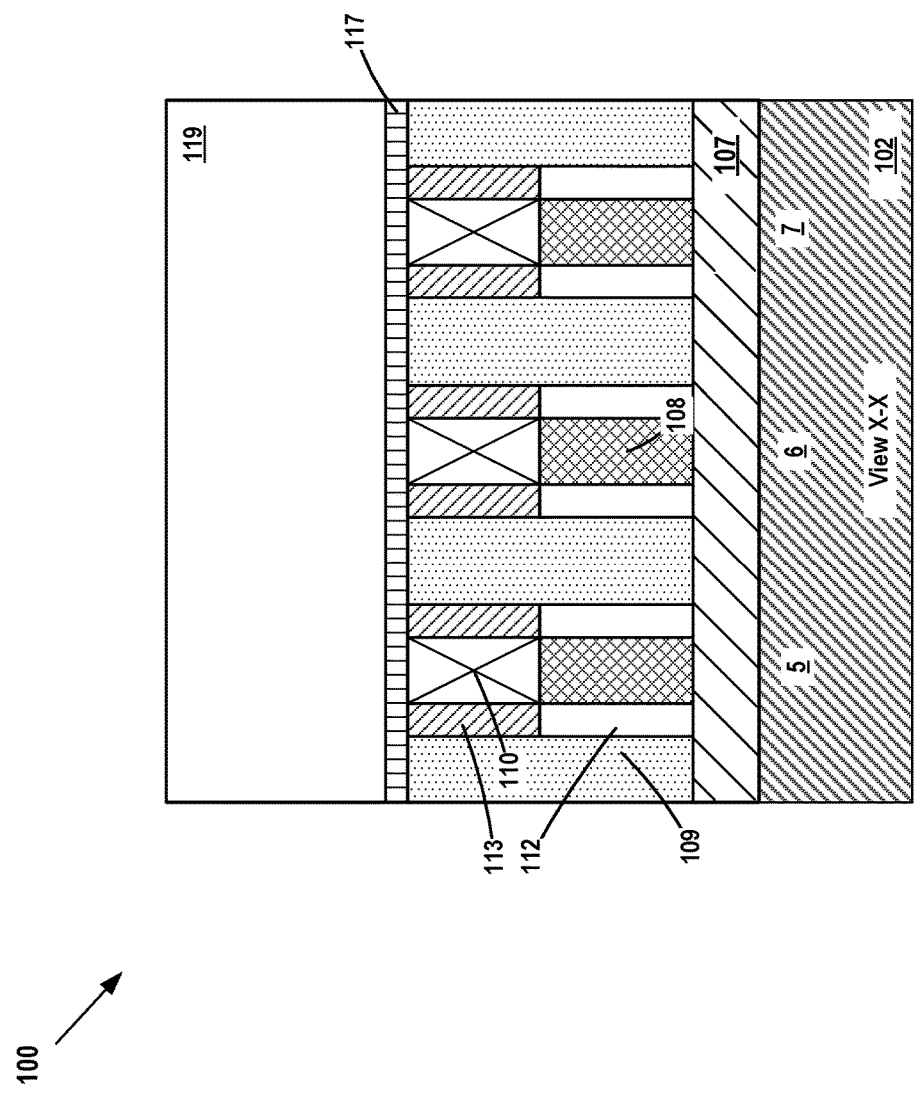

FIGS. 17 and 18 depict the IC product 100 at a point in fabrication that corresponds to that shown in FIG. 4, i.e., after the formation of the above-described etch stop layer 117 and layer of insulating material 119.

Figure 19:
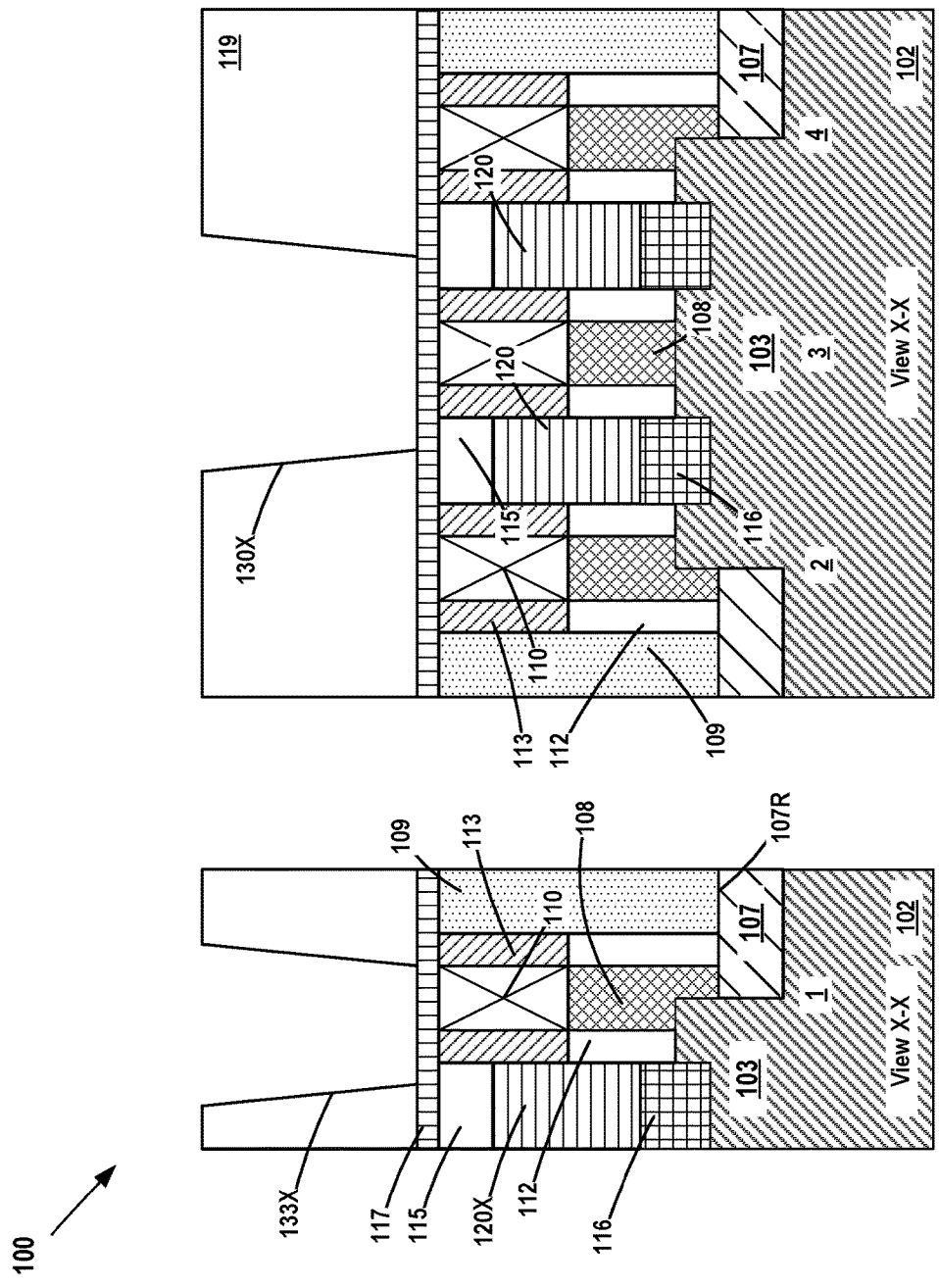
Figure 20:
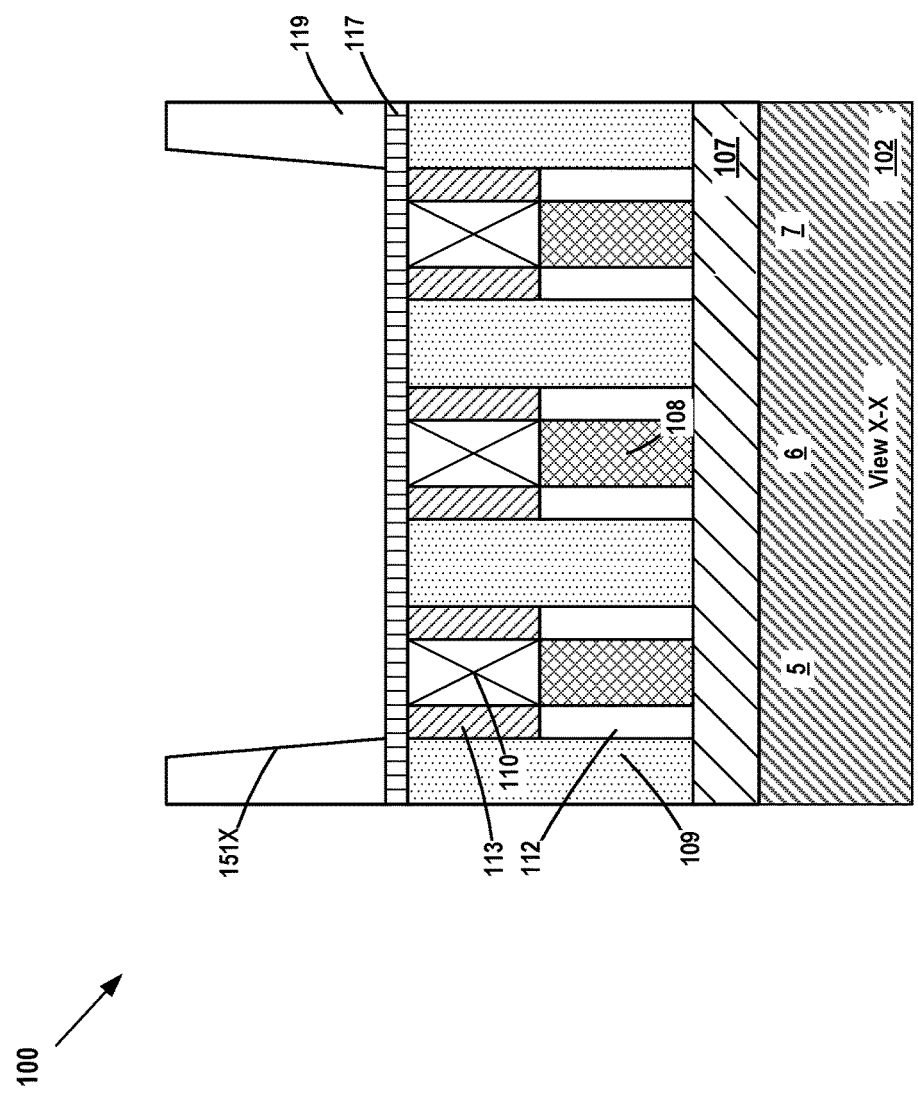

FIGS. 19 and 20 depict the IC product 100 after the above-described openings 133X and 130X were formed in the layer of insulating material 119 and after an opening 151X was formed in the layer of insulating material 119 at a location where the CB gate contact structures 151 will be formed to contact the gate structures 108 of gates 5-7.

Figure 21:
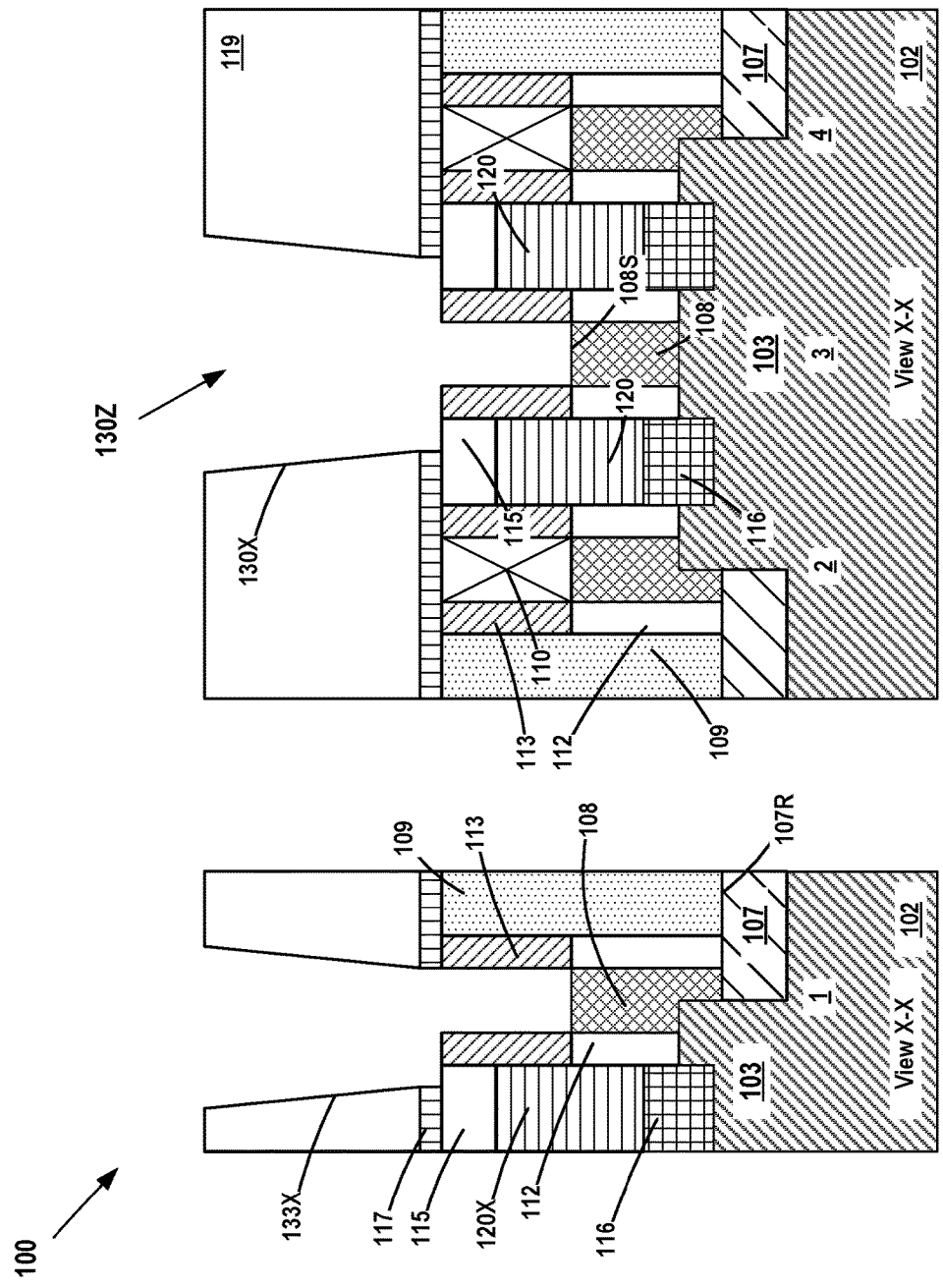
Figure 22:
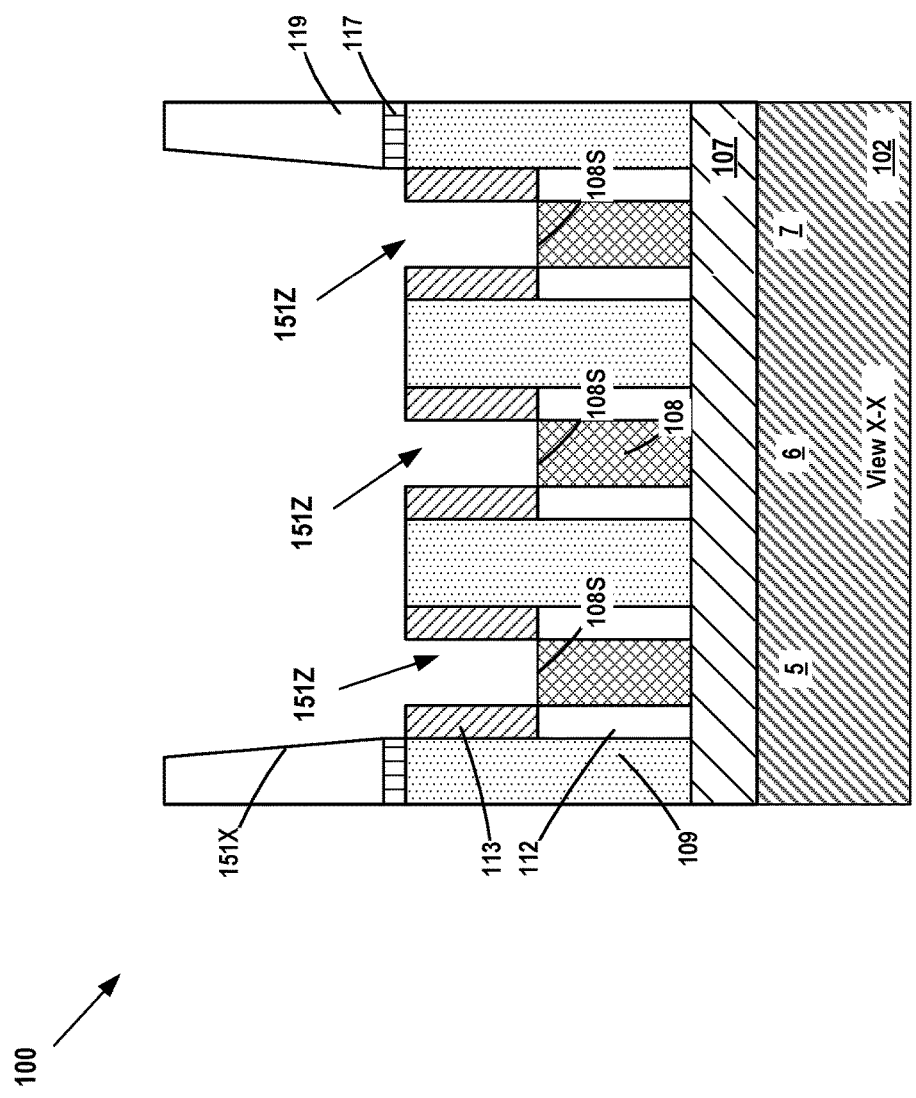

FIGS. 21 and 22 depict the IC product 100 after an etching process was performed through the openings 133X, 130X and 151X to selectively remove the exposed portions of the etch stop layer 117 as well as the gate caps 110 for gates 1, 3 and 5-7 relative to the surrounding materials. This process operation exposes the upper surface 108S of the gate structures 108 of gates 1, 3 and 5-7. Note that, during this etching process, the second spacers 113 and the insulating source/drain cap 115 protect the source/drain contact structures 120, 120X. This process operation also forms a CB gate contact opening 130Z for the CB gate contact structure 130 as well as a plurality of CB gate contact openings 151Z for each of the gates 5-7.

Figure 23:
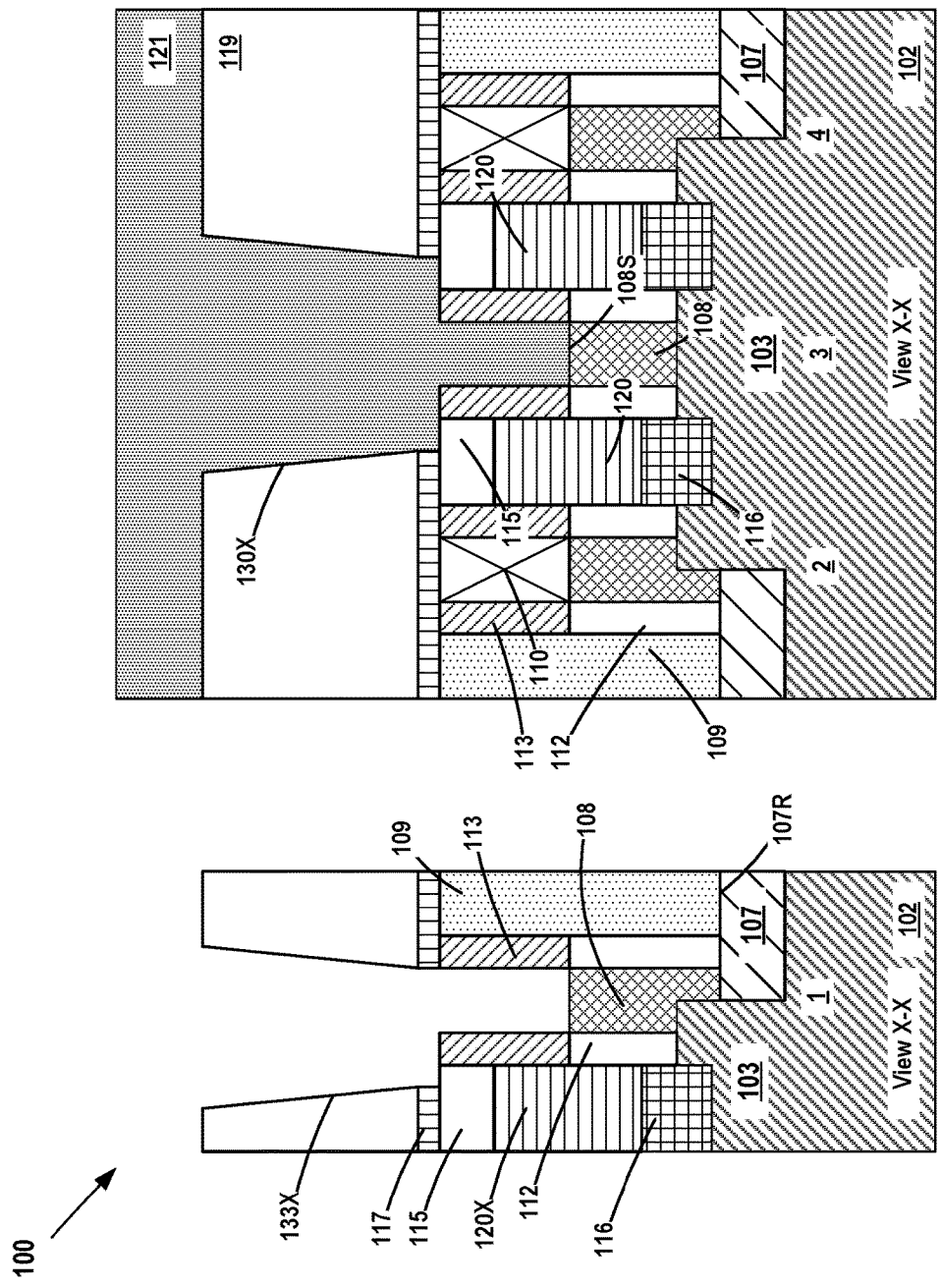
Figure 24:
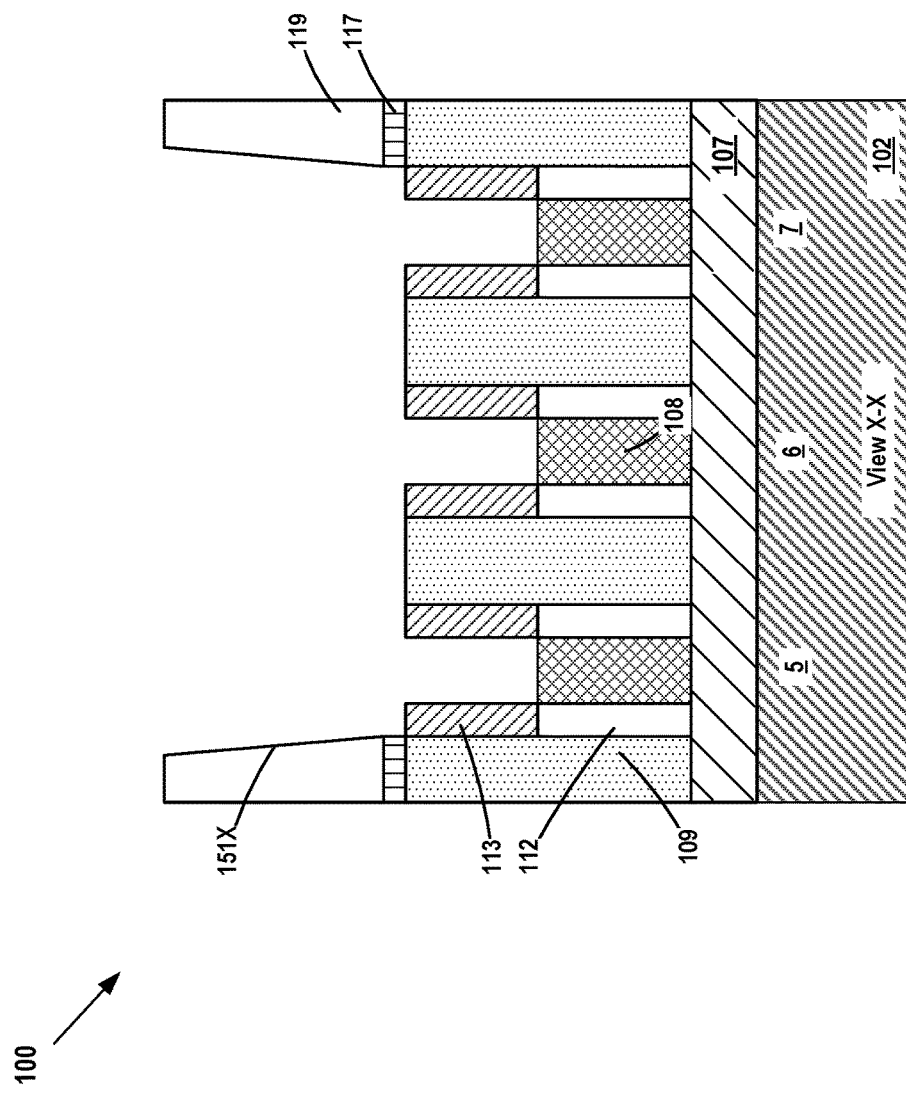

FIGS. 23 and 24 depict the IC product 100 the above-described masking layer 121, e.g., a patterned layer of OPL, was formed so as to fill and cover the CB gate contact opening 130Z. As depicted, the masking layer 121 leaves gates 1 and 5-7 exposed for further processing.

Figure 25:
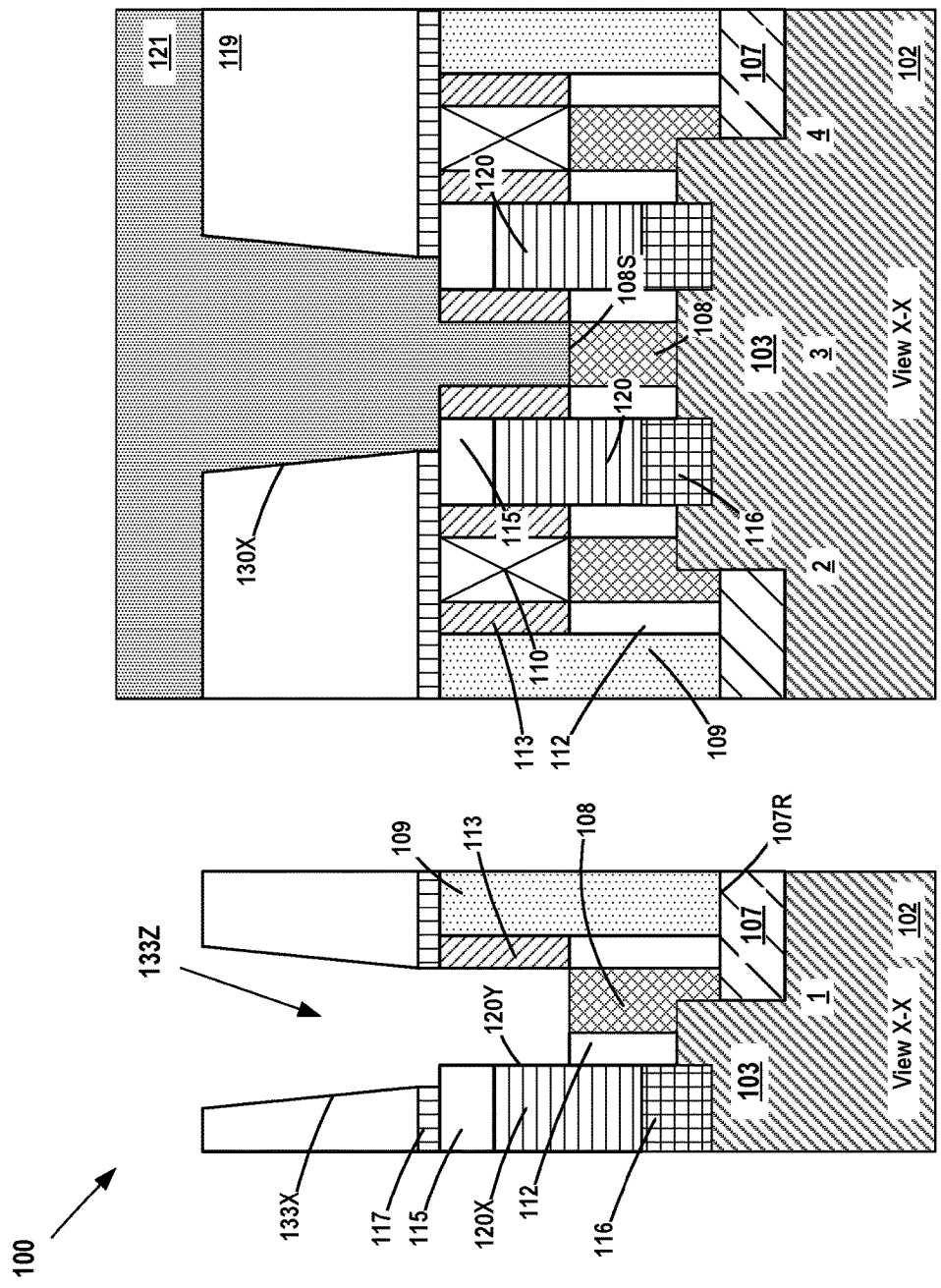
Figure 26:
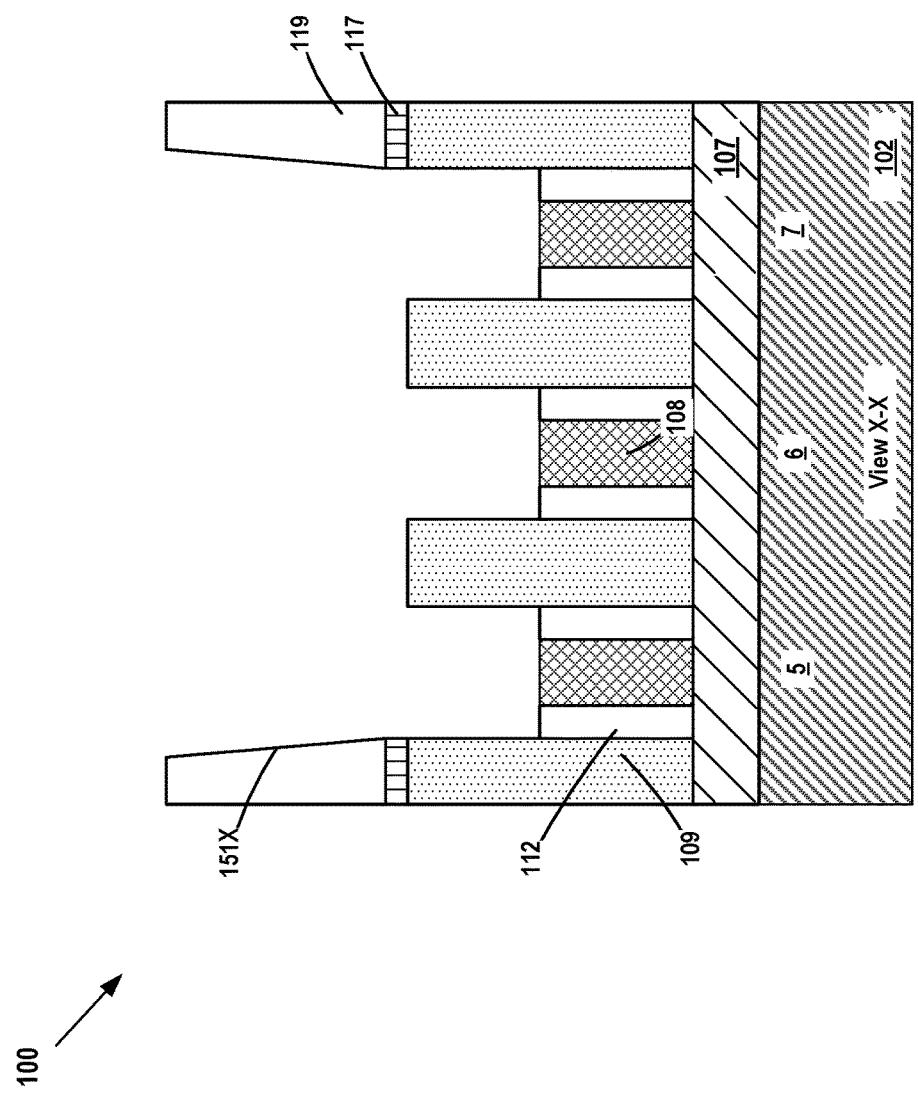

FIGS. 25 and 26 depict the IC product 100 an etching process was performed to selectively remove at least the portion of the second sidewall spacer 113 positioned adjacent the source/drain contact structure 120X of the first transistor device 101A and thereby expose a portion of a side surface 120Y of the source/drain contact structure 120X. As shown in FIG. 26, this etching process also removes the second spacers 113 of gates 5-7 of the plurality of additional transistor devices. Note that, unlike the previous embodiment, in this illustrative process flow, the exposed portion of the insulating source/drain cap 115 positioned above the source/drain contact structure 120X is not removed, i.e., the upper surface of the recessed source/drain contact structure 120X is not exposed. This process operation also forms an embodiment of the GSD contact opening 133Z for the GSD contact structure 133.

Figure 27:
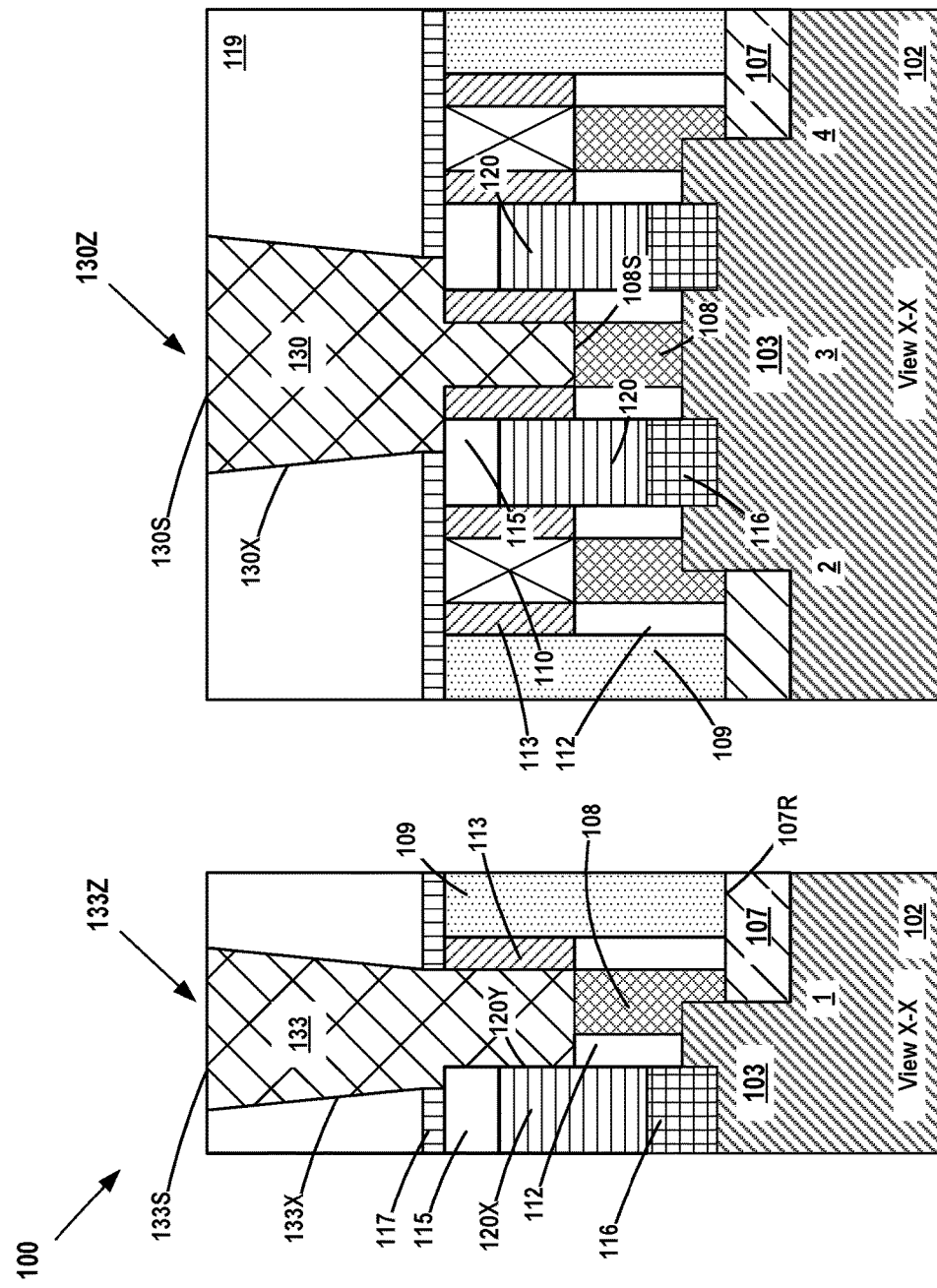
Figure 28:
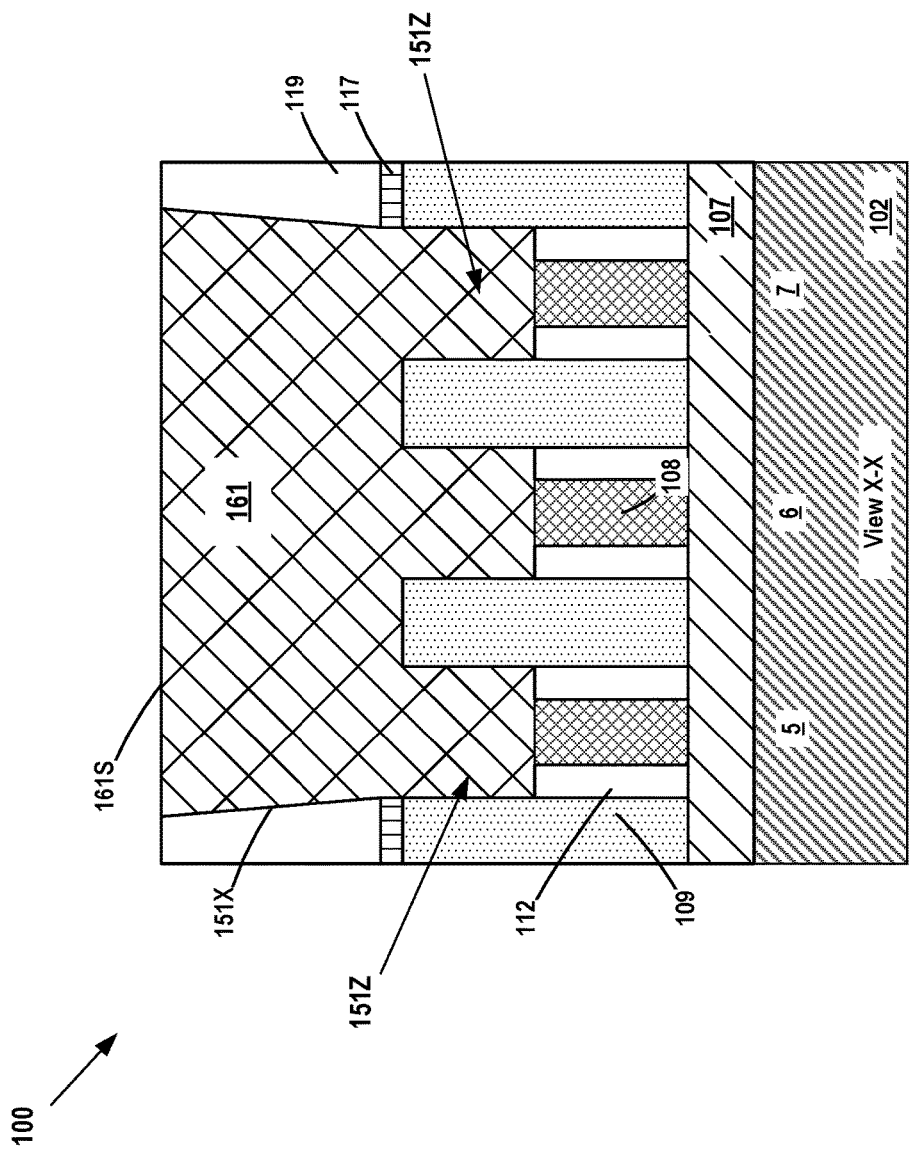

FIGS. 27 and 28 depict the IC product 100 after several process operations were performed. First, the masking layer 121 was removed so as to re-expose the CB gate contact opening 130Z. Thereafter, the above-described conductive CB gate contact structure 130 and the above-described conductive GSD contact structure 133 were formed in the CB gate contact opening 130Z and the GSD contact opening 133Z, respectfully, and a conductive gate structure 161 was formed in the opening 151X and the gate contact openings 151Z by performing several process operations at the same time. As depicted, the upper surfaces 133S, 130S and 161S are all approximately co-planar and all positioned at a same first level above the semiconductor substrate 102. The process flow used to form these structures 130, 133 and 161 may be the same as those described above with respect to the formation of the CB gate contact structure 130 and the conductive GSD contact structure 133.

Figure 29:
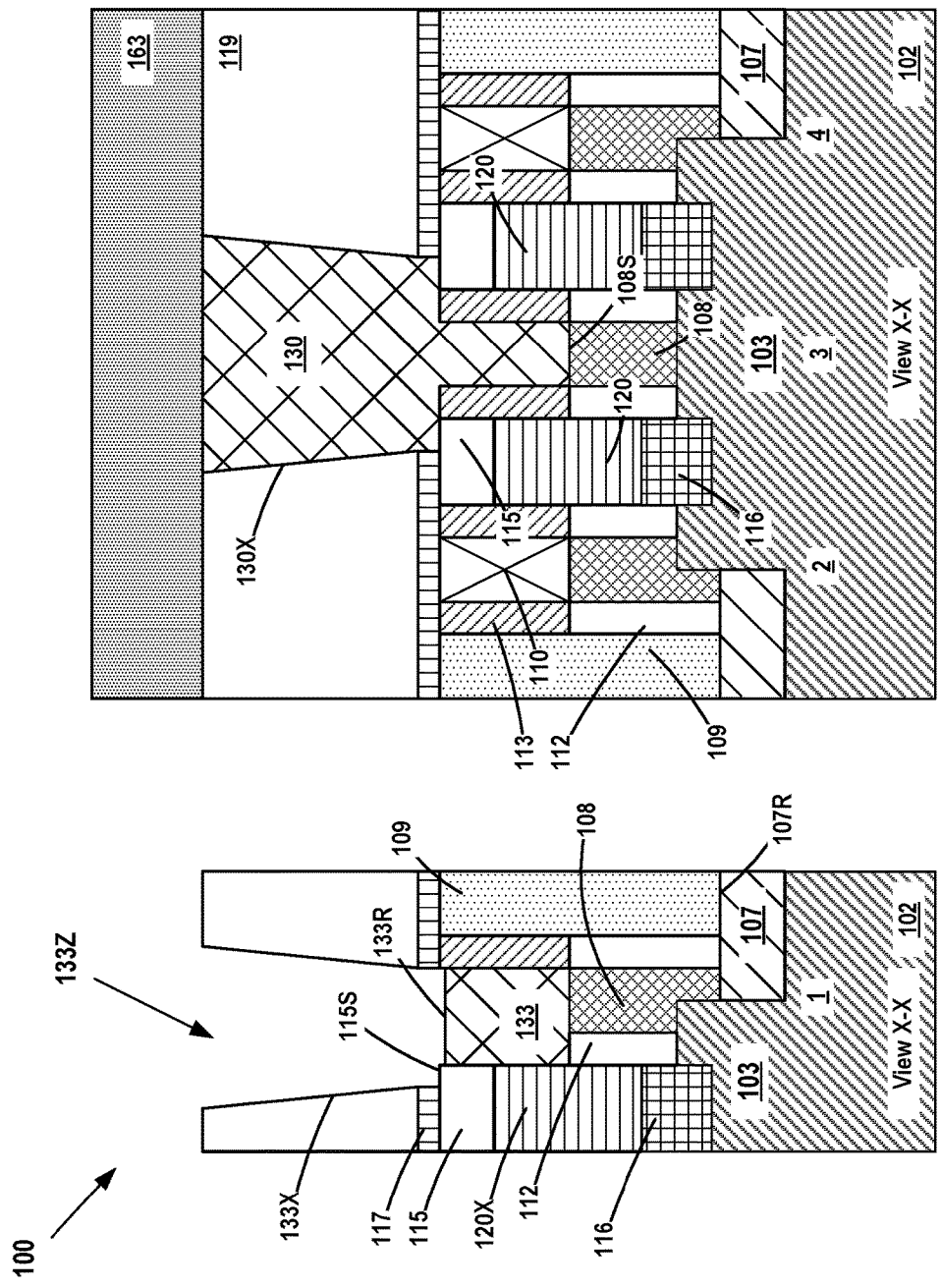
Figure 30:
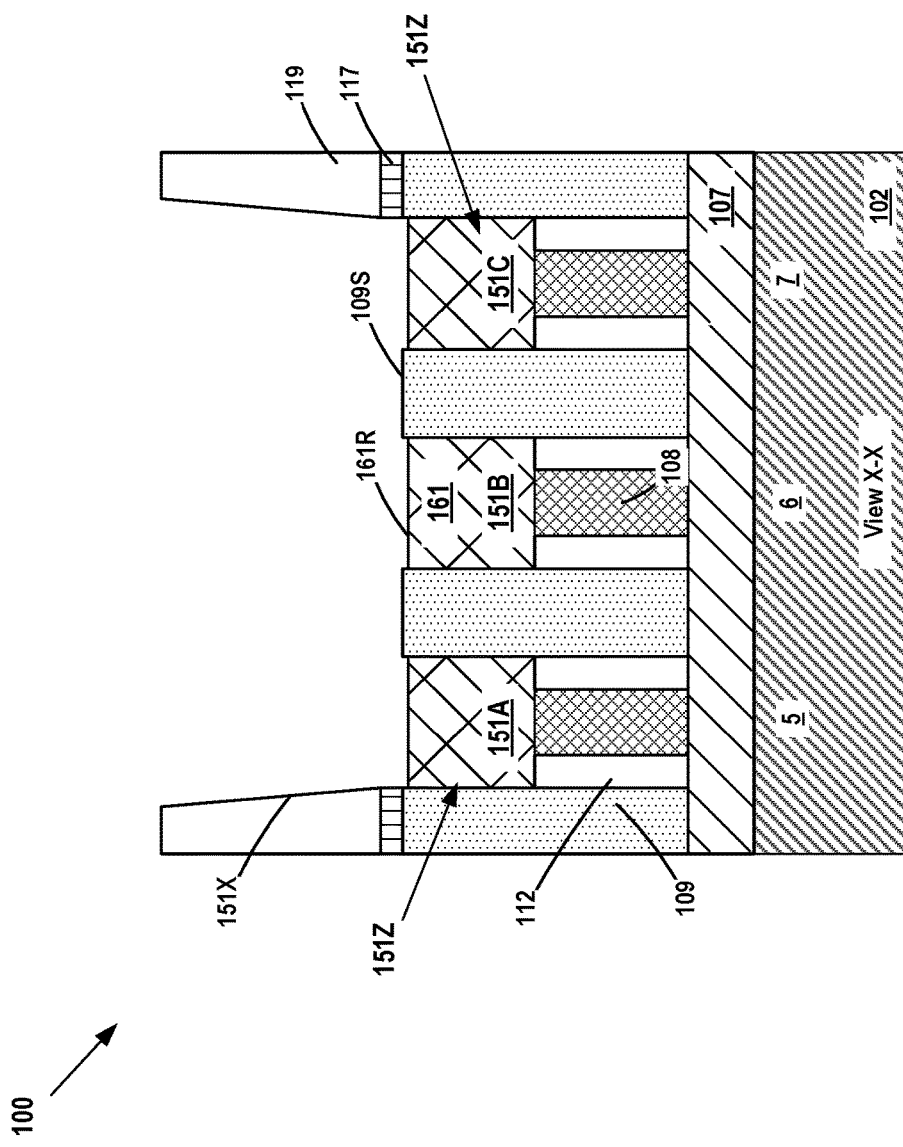

FIGS. 29 and 30 depict the IC product 100 after several process operations were performed. First, another masking layer 163, e.g., a patterned layer of OPL, was formed so as to cover the CB gate contact structure 130. As depicted, the masking layer 163 leaves the GSD contact structure 133 and the conductive gate structure 161 exposed for further processing. Then, a recess etching process was performed on the conductive GSD contact structure 133 and the conductive gate structure 161 such that they have post-etch recessed upper surfaces 133R, 161R, respectively, that are both at approximately the same level. The amount of recessing may vary depending upon the particular application. In one illustrative embodiment, the recess etching process should leave the recessed upper surface 133R at a level that is below a level of the upper surface 115S of the insulating source/drain cap 115 and the recessed upper surface 161R at a level that is below a level of the upper surface 109S of the layer of insulating material 109. The recessing of the conductive gate structure 161 results in the formation of separate CB gate contact structures 151A, 151B and 151C for the gate structure 108 of each of the gates 5-7 of the additional transistor devices. Note that, in contrast to the previous embodiment, in this illustrative process flow, the CB gate contact structure 130 is not recessed.

Figure 31:
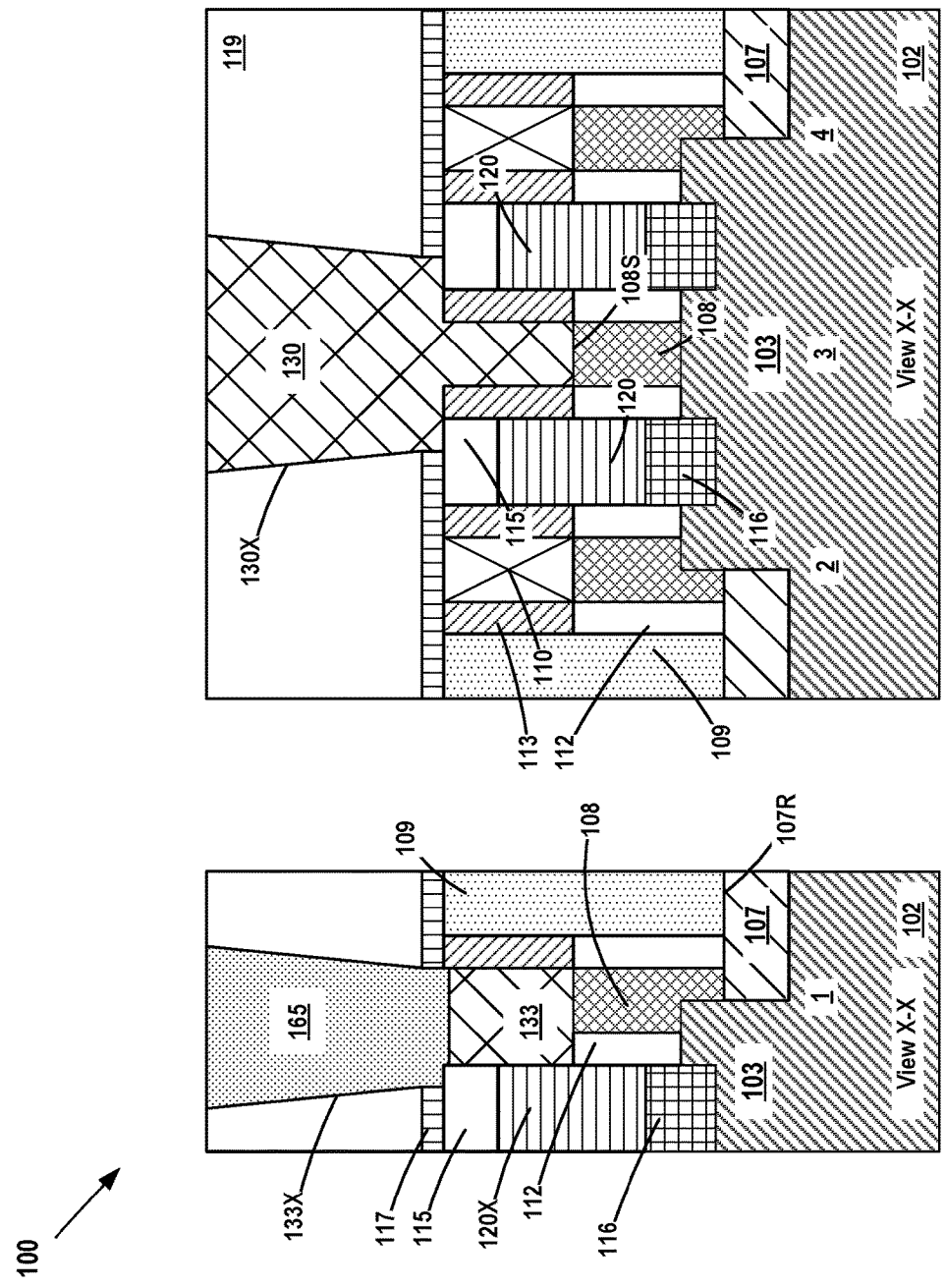
Figure 32:
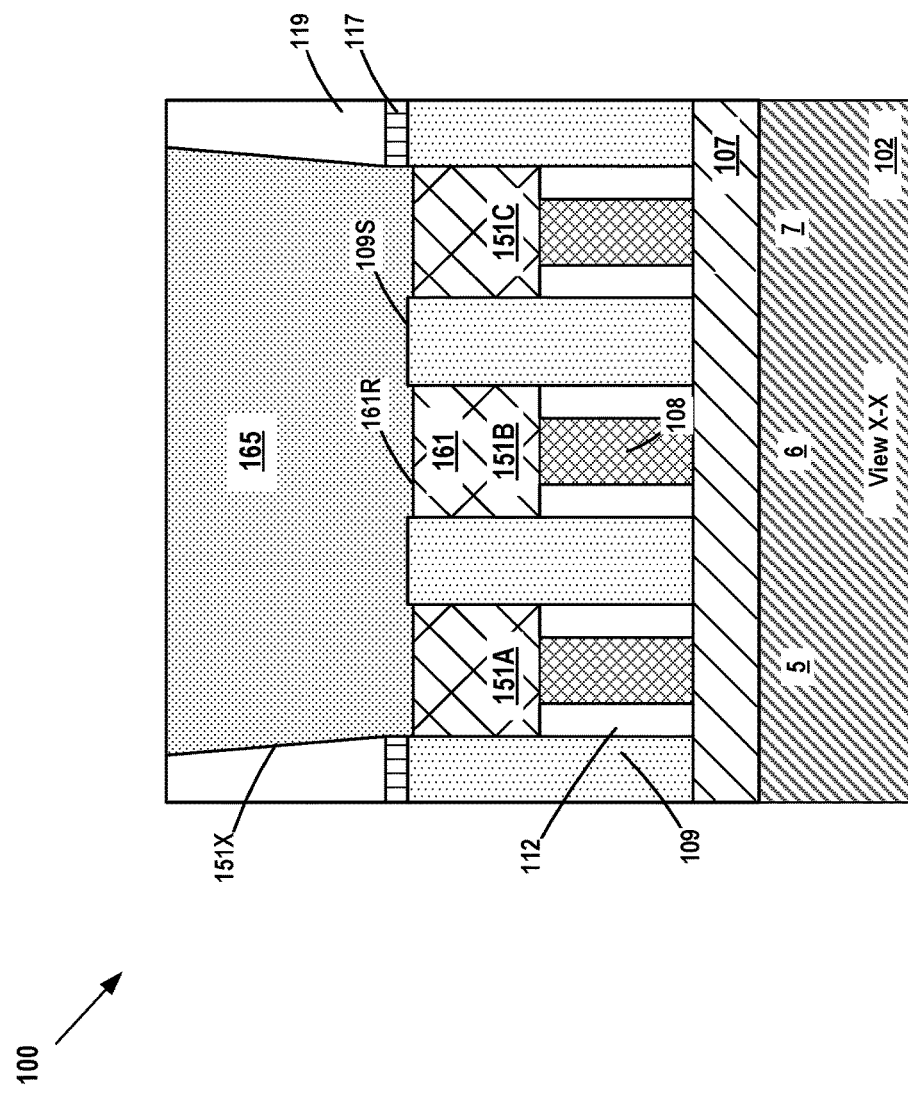

FIGS. 31 and 32 depict the IC product 100 after several process operations were performed. First, the masking layer 163 was removed. Then, additional insulating material 165 was formed in the remaining portions of the openings 133X and 151X, above the recessed conductive GSD contact structure 133 and the gate contact structures 151, respectively. The additional insulating material 165 may be formed by depositing a layer of insulating material, e.g., silicon nitride, so as to over-fill the openings 133X and 151X and then performing a CMP process. The additional insulating material 165 may be made of the same material as that of the layer 119 or it may be made of a different material (so as to facilitate the formation of a self-aligned via later in the process).

Figure 33:
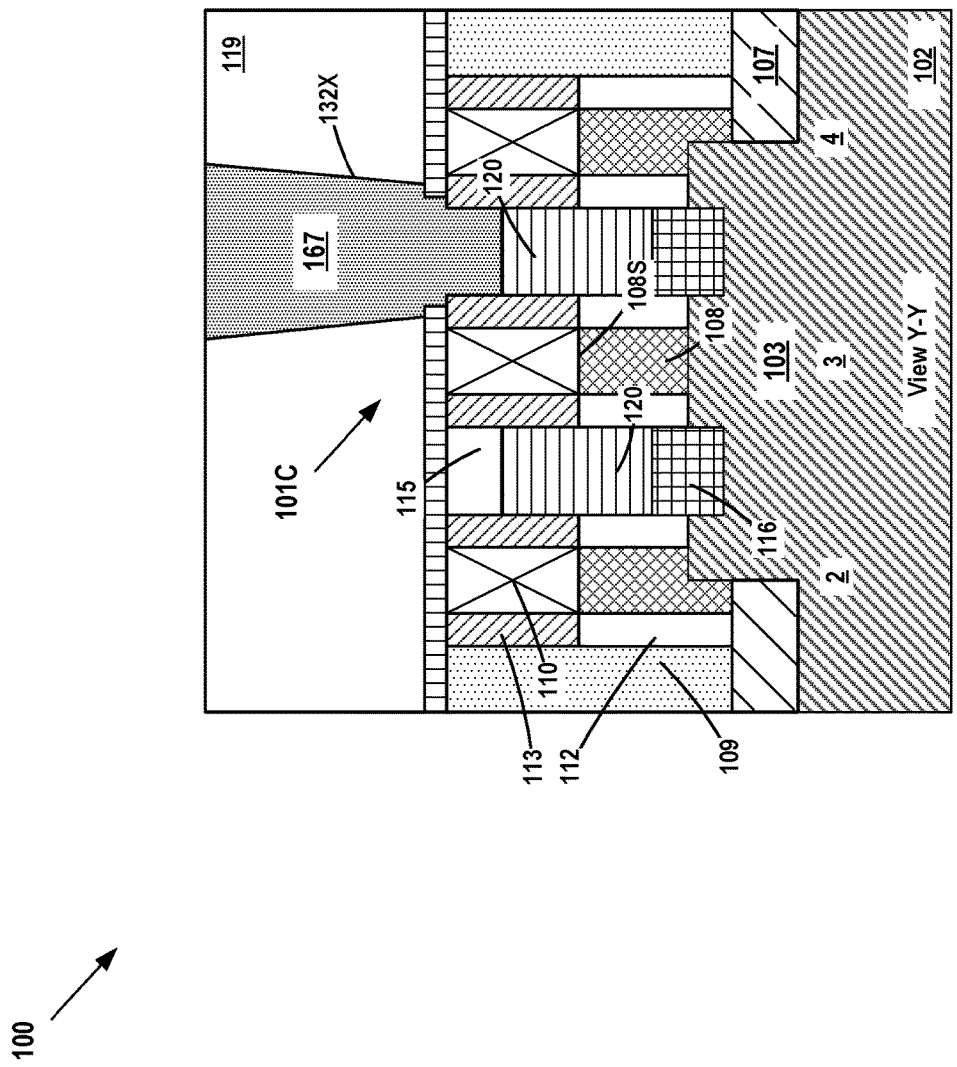

FIG. 33 depicts the product after several process operations were performed. First the contact opening 132X for a conductive contact 132 that will be formed to establish electrical connection to the source/drain contact structure 120 of the third transistor 101C was formed in the layer of insulating material. Thereafter, another layer of sacrificial material 167, e.g., an OPL material, was formed so as to fill the contact opening 132X and temporarily protect the underlying source/drain contact structure 120 as additional process operations are performed. The sacrificial material 167 may be formed by depositing the OPL material and then performing a CMP process.

Figure 34:
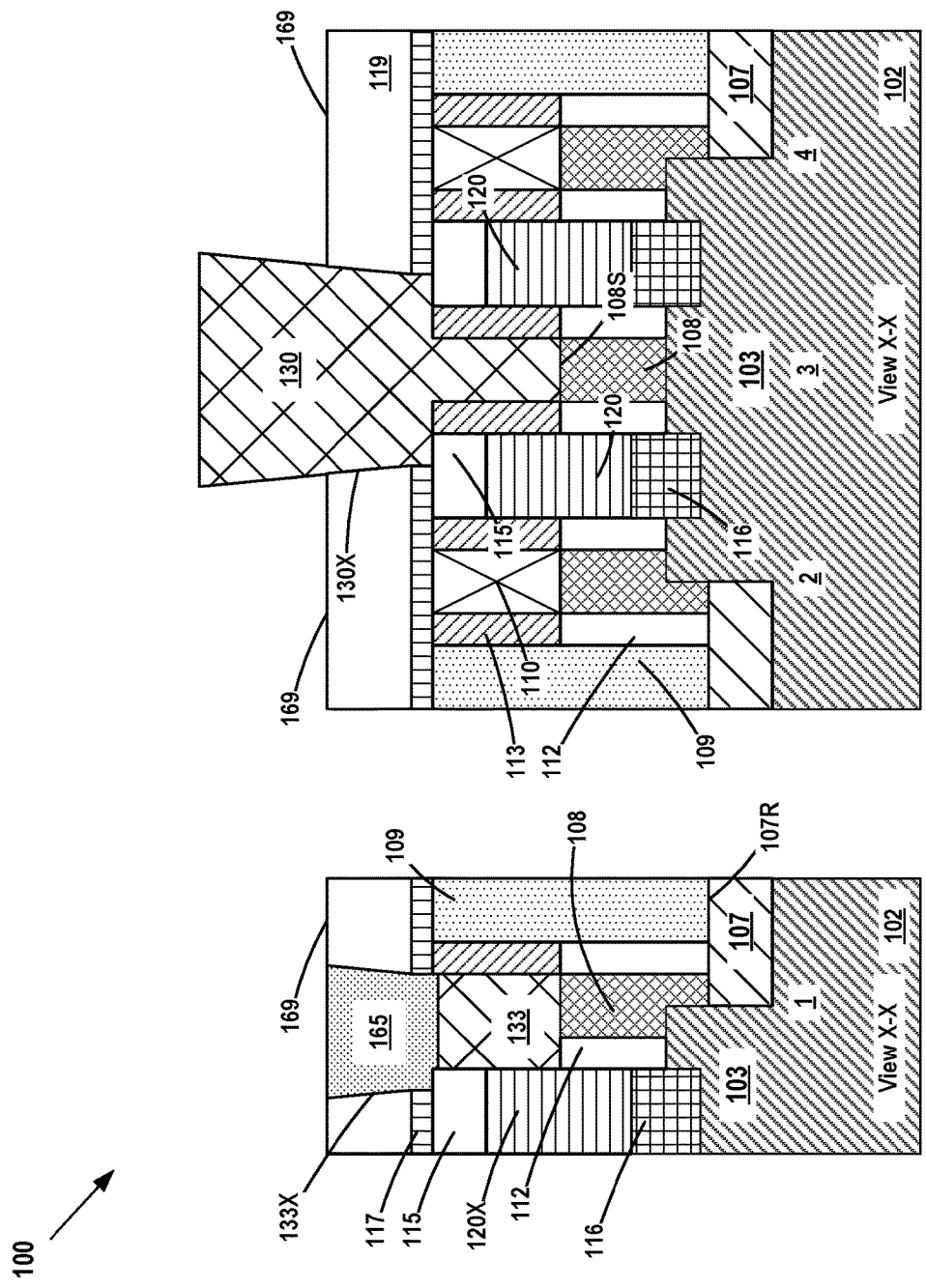
Figure 35:
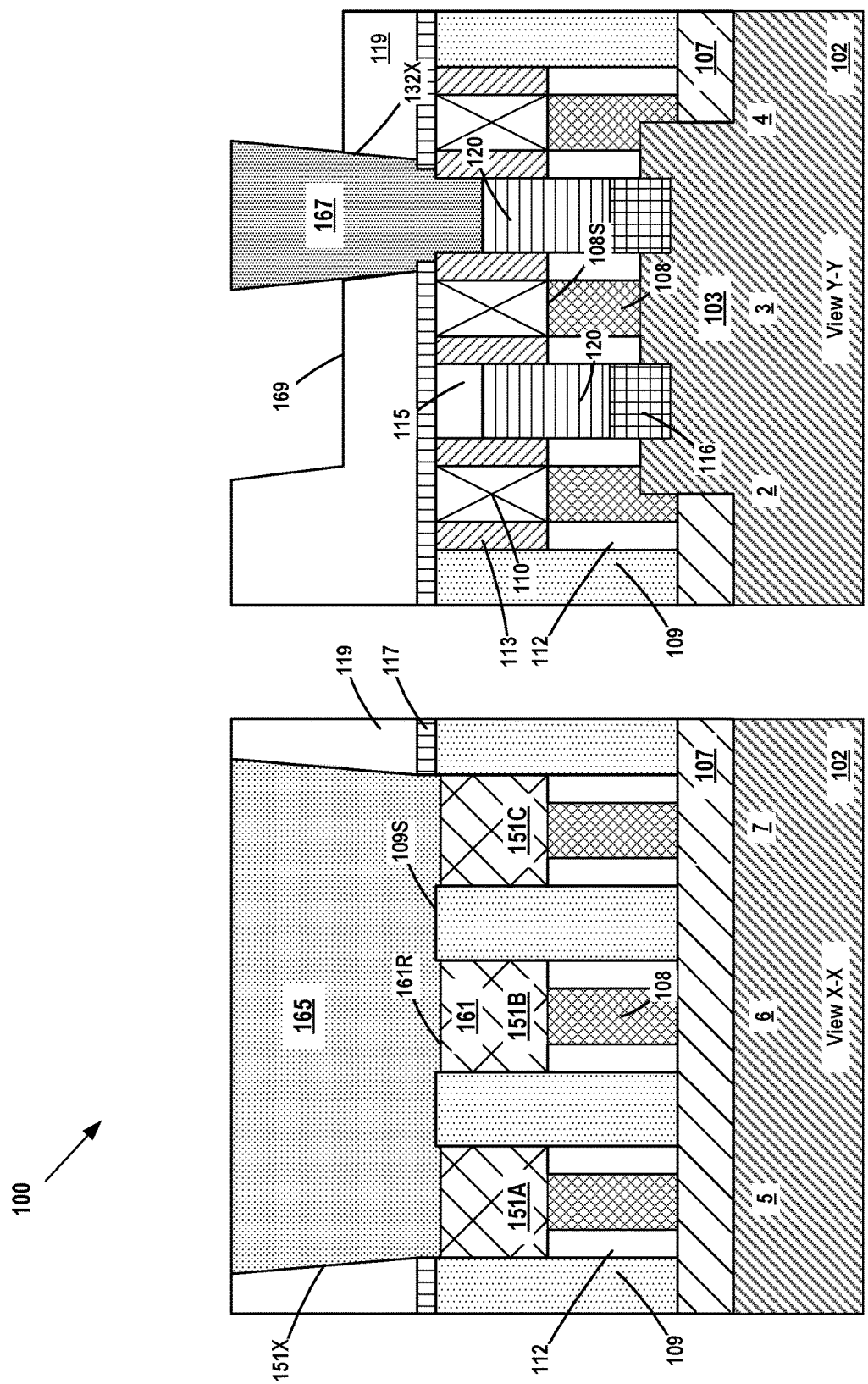

FIGS. 34 and 35 depict the IC product 100 after initial process operations were performed to form the above-described conductive M0 metallization layer above the product 100. As before, the M0 metallization layer comprises a plurality of separate conductive lines 139A, 139B (collectively referenced using the reference numeral 139). As depicted in FIGS. 34 and 35, various openings or trenches 169 for the conductive metal lines 139 were formed in the layer of insulating materials 119, 165. The trenches 169 may be formed by performing an etching process through a patterned etch mask (not shown) using traditional photolithography and etching processes.

Figure 36:
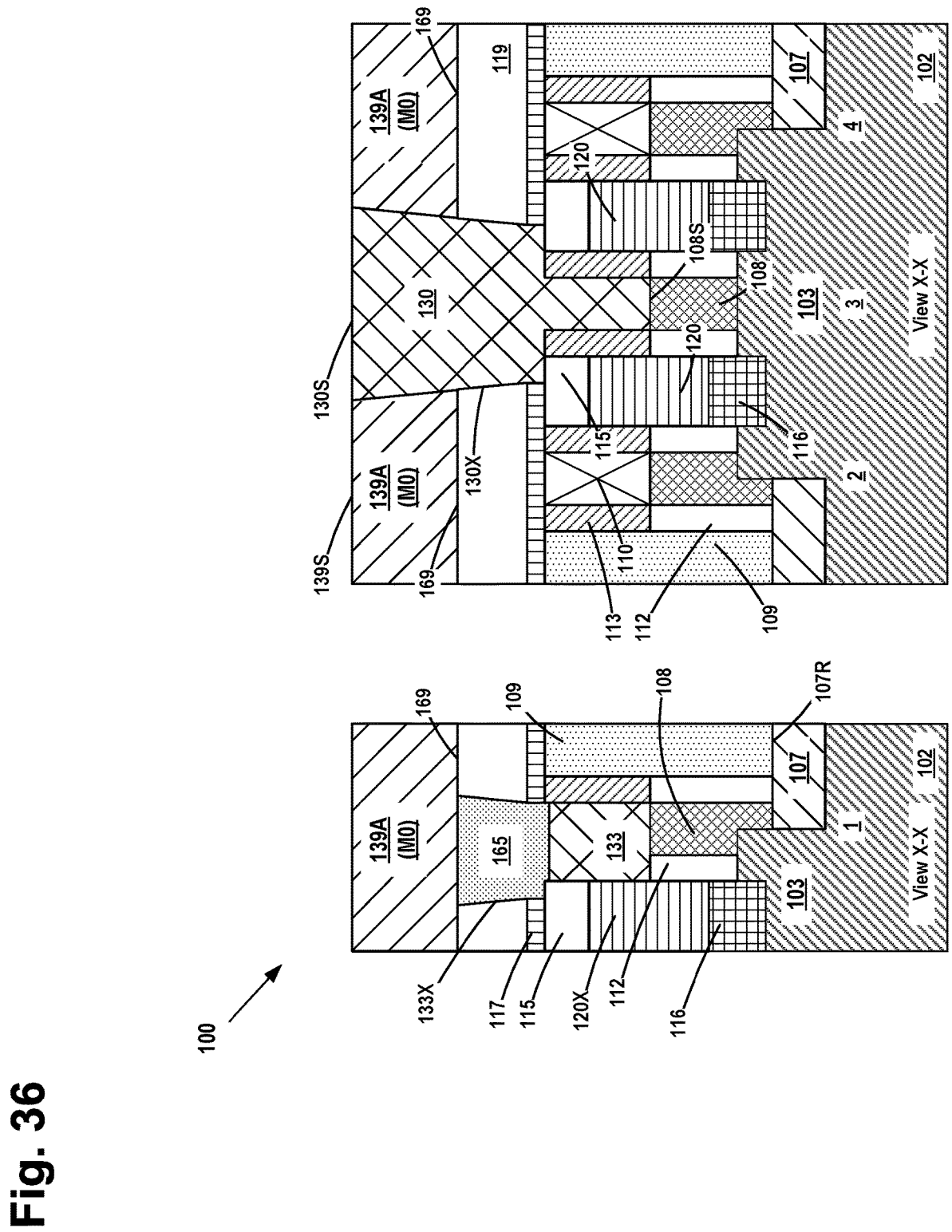
Figure 37:
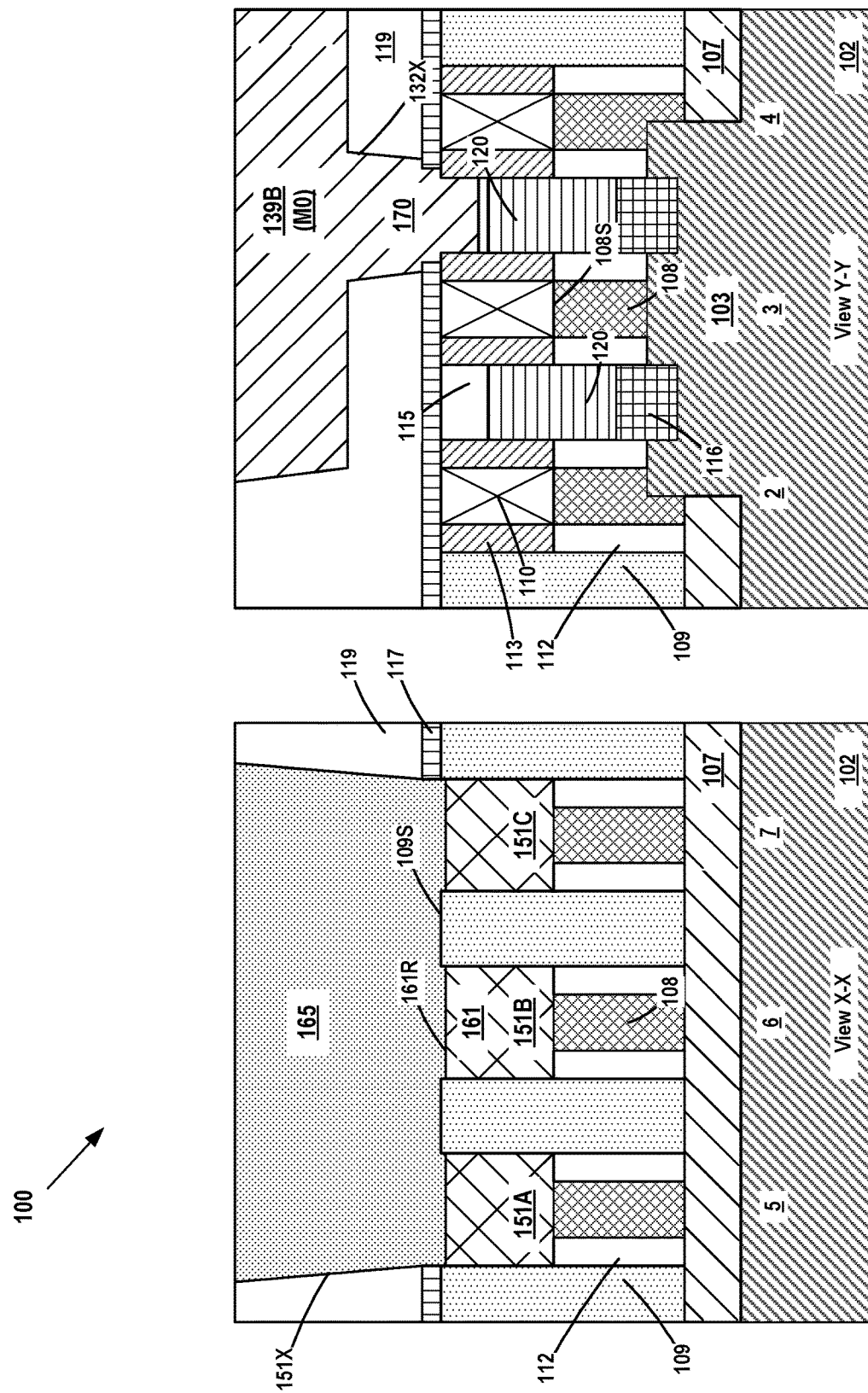

FIGS. 36 and 37 depict the IC product 100 after several process operations were performed. First, the sacrificial material 167 was removed so as to expose the source/drain contact structure 120 adjacent gate 3. Then, the method involves formation of a plurality of conductive metal lines 139 as well as a conductive via 170 that contacts the source/drain contact structure 120 adjacent gate 3 (see FIG. 37, view Y-Y) in the layer of insulating material 119, 165. As depicted, the first metal line 139A is conductively coupled and physically contacts the CB gate contact 130, while the second conductive line 139B is conductively coupled to the conductive via 170 that is coupled to the source/drain contact structure 120 of the third transistor. Note that, as shown in FIG. 36, due to the recessing of the GSD contact structure 133, the first metal line 139A is physically (vertically) spaced apart from the GSD contact structure 133 thereby providing physical room to position the first conductive line 139A above the GSD contact structure 133. Stated another way, using the novel methods disclosed herein, the recessed GSD contact structure 133 does not prevent or block the first metal line 139A from being formed as would be the case if the GSD contact structure 133 was not recessed. In one illustrative process flow, the metal lines 139 and the via 170 may be formed using techniques similar to those described above with respect to the formation of the conductive contacts 132.

Figure 38:
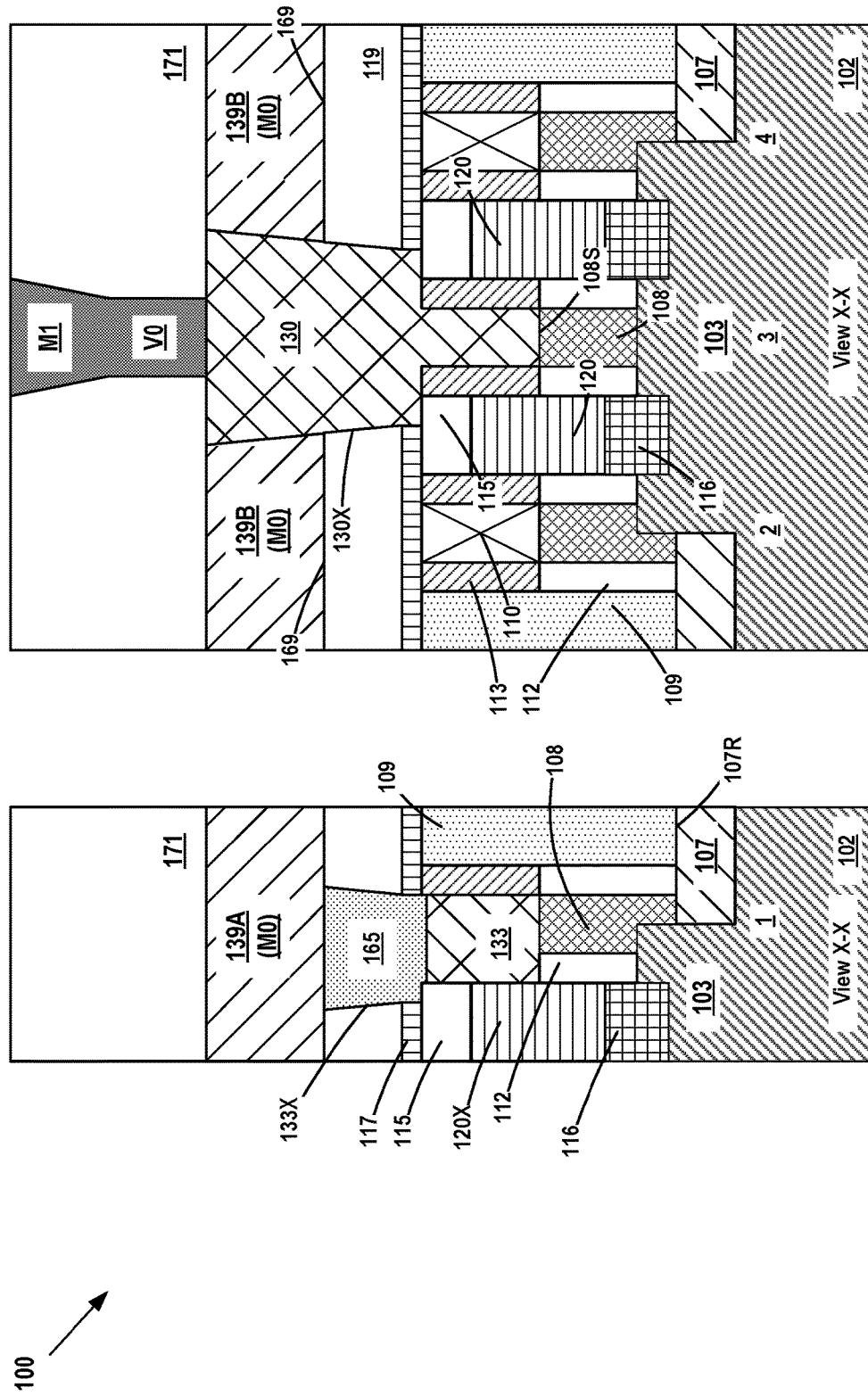
Figure 39:
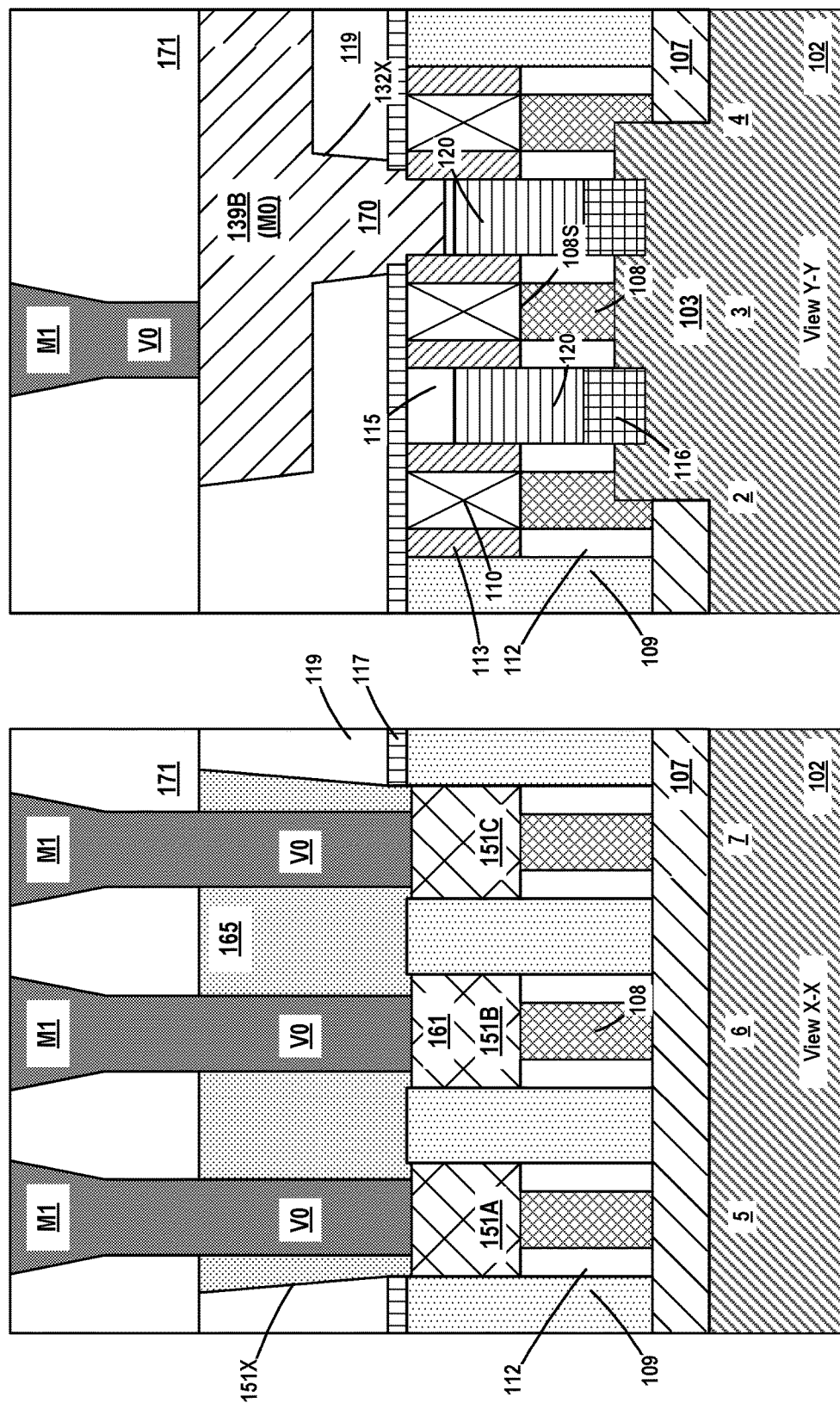

FIGS. 38 and 39 depict the IC product 100 after several process operations were performed to form an illustrative M1 metallization layer above the M0 metallization layer. The M1 metallization layer comprises a plurality of simplistically depicted M1 metal lines and conductive V0 vias. As depicted, a layer of insulating material 171 was formed above the product. Thereafter, various openings or trenches were formed in various layers of insulating material on the product 100. Then, the conductive materials for the conductive M1 metal lines and the conductive V0 vias were formed in the openings in the layers of insulating material and a CMP process was performed. As shown, a first conductive line M1 line and first conductive V0 via positioned in the second metallization layer are conductively coupled to the CB gate contact structure 130. Additionally, a plurality of second conductive M1 lines and extended length V0 conductive vias are positioned in the second metallization layer and conductively coupled to one of the separate CB gate contact structures 151 of the additional transistor devices.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
   forming a source/drain region of a first transistor;
   forming a conductive source/drain contact structure contacting the source/drain region;
   forming a gate-to-source/drain (GSD) contact opening in at least one layer of insulating material exposing at least one surface of said conductive source/drain contact structure of said first transistor and a first gate structure, wherein a height of said conductive source/drain contact structure is greater than a height of said first gate structure;
   forming a gate contact opening in said at least one layer of insulating material exposing a second gate structure;
   forming an initial gate-to-source/drain (GSD) contact structure in said GSD contact opening conductively coupled to said conductive source/drain contact structure of and said first gate structure;
   forming an initial gate contact structure in said gate contact opening conductively coupled to said second gate structure, wherein an upper surface of each of said GSD contact structure and said gate contact structure k positioned at a first level; and
   performing a recess etching process on said initial GSD contact structure and said initial gate contact structure to form a recessed GSD contact structure and a recessed gate contact structure, wherein a recessed upper surface of each of said recessed GSD contact structure and said recessed gate contact structure is positioned at a second level that is below said first level, and said second level is below an uppermost surface of said at least one layer of insulating material.

2. The method of claim 1, wherein forming said GSD contact opening comprises exposing at least one side surface of said conductive source/drain contact structure.

3. The method of claim 1, wherein forming said GSD contact opening comprises performing an etching process to remove at least a portion of an insulating source/drain cap positioned above said conductive source/drain contact structure so as to expose at least a portion of an upper surface of said conductive source/drain contact structure.

4. The method of claim 1, wherein forming said gate contact opening comprises removing a gate cap positioned above said second gate structure, wherein said gate contact structure is conductively coupled to said second gate structure.

5. The method of claim 1, wherein said conductive source/drain contact structure has an insulating source/drain cap positioned above at least a portion of an upper surface of said conductive source/drain contact structure, wherein said second level is at a level that is above a level of said upper surface of said insulating source/drain cap.

6. The method of claim 1, further comprising forming first and second separate conductive contact structures at a same time, said first conductive contact structure being positioned above and conductively coupled to said recessed gate contact structure, said second conductive contact being positioned above and conductively coupled to a conductive source/drain contact structure positioned above a source/drain region of a transistor device.

7. The method of claim 6, further comprising forming first and second separate conductive lines, said first conductive line being positioned vertically above at least a portion of both said recessed GSD contact structure and said recessed gate contact structure, wherein said first conductive line is conductively coupled to said first conductive contact structure and wherein an insulating material k positioned vertically between said first conductive line and said recessed GSD contact structure, said second conductive line being conductively coupled to said second conductive contact structure.

8. The method of claim 1, further comprising forming a single conductive line that is positioned vertically above at least a portion of both said recessed GSD contact structure and a-said recessed gate contact structure, wherein said single conductive line is conductively coupled to said recessed gate contact structure and wherein an insulating material is positioned vertically between said single conductive line and said recessed GSD contact structure.

9. The method of claim 1, further comprising forming said gate contact opening prior to forming said GSD contact opening.

10. The method of claim 1, wherein forming said GSD contact opening comprises removing at least a portion of a sidewall spacer positioned adjacent said conductive source/drain contact structure.

11. The method of claim 1, wherein said first level is coplanar with said uppermost surface of said at least one layer of insulating material.

12. The method of claim 1, further comprising forming a layer of insulating material above a substrate, wherein said first source/drain region is formed in said substrate and said first gate structure partially overlaps said substrate and partially overlaps said layer of insulating material.

13. A method, comprising:
forming a source/drain region of a first transistor;
forming a conductive source/drain contact structure contacting the source/drain region;
forming a gate-to-source/drain (GSD) contact opening in at least one layer of insulating material exposing at least one surface of said conductive source/drain contact structure of said first transistor and a first gate structure, wherein a height of said conductive source/drain contact structure is greater than a height of said first gate structure;
forming a gate contact opening in at least one layer of insulating material exposing a second gate structure;
forming an initial gate-to-source/drain (GSD) contact structure in said gate-to-source/drain GSD contact opening conductively coupled to said conductive source/drain contact structure and said first gate structure;
forming an initial gate contact structure in said gate contact opening conductively coupled to said second gate structure, wherein an upper surface of each of said initial gate-to-source/drain GSD contact structure and said initial gate contact structure is positioned at a first level, and said first conductive source/drain contact structure has an insulating source/drain cap positioned above at least a portion of an upper surface of said conductive source/drain contact structure;
performing a recess etching process on said initial gate-to-source/drain GSD contact structure and said initial gate contact structure at a same first time to form a recessed GSD contact structure and a recessed gate contact structure, wherein a recessed upper surface of each of said recessed GSD contact structure and said recessed gate contact structure is positioned at a second level that is below said first level, said second level is at a level that is above a level of an upper surface of said insulating source/drain cap, and said second level is below an uppermost surface of said at least one layer of insulating material; and
forming first and second separate conductive contact structures at a same second time, said first conductive contact structure being positioned above and conductively coupled to said gate contact structure, said second conductive contact being positioned above and conductively coupled to a second conductive source/drain contact structure.

14. The method of claim 13, wherein forming said GSD contact opening comprises exposing at least one side surface of said first conductive source/drain contact structure.

15. The method of claim 14, wherein forming said GSD contact opening comprises performing an etching process to remove at least a portion of said insulating source/drain cap positioned above said first conductive source/drain contact structure so as to expose at least a portion of said upper surface of said first conductive source/drain contact structure.

16. The method of claim 13, further comprising forming first and second separate conductive lines, said first conductive line being positioned vertically above at least a portion of both said recessed GSD contact structure and said recessed gate contact structure, wherein said first conductive line is conductively coupled to said first conductive contact structure and wherein an insulating material is positioned vertically between said first conductive line and said recessed GSD contact structure, said second conductive line being conductively coupled to said second conductive contact structure.

17. The method of claim 13, wherein said first level is coplanar with said uppermost surface of said at least one layer of insulating material.

18. The method of claim 13, further comprising forming a layer of insulating material above a substrate, wherein said first source/drain region is formed in said substrate and said first gate structure partially overlaps said substrate and partially overlaps said layer of insulating material.

* * * * *

UNITED STATES PATENT AND TRADEMARK OFFICE
CERTIFICATE OF CORRECTION

PATENT NO. : 10,651,284 B2
APPLICATION NO. : 15/791650
DATED : May 12, 2020
INVENTOR(S) : Ruilong Xie et al.

Page 1 of 1

It is certified that error appears in the above-identified patent and that said Letters Patent is hereby corrected as shown below:

In the Claims

Column 14, Line 44 (Claim 1, Line 17), delete "of" before "and".

Column 14, Line 48 (Claim 1, Line 21), change "k" to -- is --.

Column 15, Line 26 (Claim 7, Line 7), change "k" to -- is --.

Signed and Sealed this
Fourteenth Day of July, 2020

Andrei Iancu
*Director of the United States Patent and Trademark Office*